(12) United States Patent
Sukegawa et al.

(10) Patent No.: US 8,107,301 B2
(45) Date of Patent: *Jan. 31, 2012

(54) MEMORY CONTROLLER

(75) Inventors: Hiroshi Sukegawa, Tokyo (JP); Takeshi Nakano, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 253 days.

This patent is subject to a terminal disclaimer.

(21) Appl. No.: 12/480,441

(22) Filed: Jun. 8, 2009

(65) Prior Publication Data

US 2009/0241012 A1   Sep. 24, 2009

Related U.S. Application Data

(63) Continuation of application No. 11/776,037, filed on Jul. 11, 2007, now Pat. No. 7,558,148.

(30) Foreign Application Priority Data

Jul. 14, 2006   (JP) .................................. 2006-194804

(51) Int. Cl.
*G11C 11/34* (2006.01)
(52) U.S. Cl. .......... 365/185.33; 365/185.18; 365/185.09
(58) Field of Classification Search ............. 365/185.33, 365/185.03, 185.17, 185.18, 185.29, 185.23, 365/185.22, 185.24, 185.25, 185.11, 230.06
See application file for complete search history.

(56) References Cited

U.S. PATENT DOCUMENTS

| | | | |
|---|---|---|---|
| 5,969,990 A | 10/1999 | Arase | |
| 6,180,454 B1 | 1/2001 | Chang et al. | |
| 6,288,940 B1 | 9/2001 | Kawamura | |
| 6,388,919 B2 | 5/2002 | Terasaki | |
| 6,400,602 B2 | 6/2002 | Takata et al. | |
| 7,023,739 B2 | 4/2006 | Chen et al. | |
| 7,366,024 B2 * | 4/2008 | Yeh | 365/185.27 |
| 7,394,691 B2 | 7/2008 | Shibata et al. | |
| 7,457,156 B2 * | 11/2008 | Nazarian | 365/185.03 |

FOREIGN PATENT DOCUMENTS

| | | |
|---|---|---|
| JP | 10-208490 | 8/1998 |
| JP | 2005-235260 | 9/2005 |
| JP | 2005-285184 | 10/2005 |

OTHER PUBLICATIONS

"SmartMedia™ Physical Format Specifications," Version 1.21, SSFDC Forum Technical Committee, May 19, 1999, 28 pages.
Office Action in Japanese Appln, 2006-194804 mailed Aug. 23, 2011 (with English translation).

* cited by examiner

*Primary Examiner* — Dang T Nguyen
(74) *Attorney, Agent, or Firm* — Oblon, Spivak, McClelland, Maier & Neustadt, L.L.P.

(57) ABSTRACT

A memory controller for writing data in a first semiconductor memory including a plurality of memory cells having series-connected current paths and charge storage layers includes a host interface which configured to be receivable of first data from a host apparatus, a second semiconductor memory which temporarily holds second data, and an arithmetic unit which generates the second data in accordance with the state of the first semiconductor memory, temporarily holds the second data in the second semiconductor memory, and writes the first and second data in the first semiconductor memory. When writing the second data, the arithmetic unit does not select a word line adjacent to a select gate line, and selects a word line not adjacent to the select gate line.

25 Claims, 18 Drawing Sheets

When writing system information

| Pin | No. | Signal |
|---|---|---|
| Pin | 1 | Card detection/data 3 |
| Pin | 2 | Command (CMD) |
| Pin | 3 | Vss |
| Pin | 4 | Vdd |
| Pin | 5 | Clock (CLK) |
| Pin | 6 | Vss |
| Pin | 7 | Data 0 (DAT0) |
| Pin | 8 | Data 1 (DAT1) |
| Pin | 9 | Data 2 (DAT2) |

Error table

| Memory block | ECC error occurrence ratio |
|---|---|
| BLK0 | R0 |
| BLK1 | R1 |
| BLK2 | R2 |
| ⋮ | ⋮ |

MEMORY CONTROLLER

CROSS-REFERENCE TO RELATED APPLICATIONS

This Application is a Continuation of U.S. application Ser. No. 11/776,037 filed Jul. 11, 2007.

This application is based upon and claims the benefit of priority from prior Japanese Patent Application No. 2006-194804, filed Jul. 14, 2006, the entire contents of which are incorporated herein by reference.

BACKGROUND OF THE INVENTION

1. Field of the Invention

The present invention relates to a memory controller, e.g., a memory controller for controlling the operation of a nonvolatile semiconductor memory chip.

2. Description of the Related Art

With the recent rapid spread of digital cameras and portable audio players, demands for large-capacity nonvolatile semiconductor memories are increasing, and NAND flash memories (to be also simply referred to as flash memories hereinafter) are widely used as the nonvolatile semiconductor memories.

In the NAND flash memory, data is erased from a plurality of memory cells at once. This erase unit will be called a memory block hereinafter. The memory block includes a plurality of NAND cells. Each NAND cell has a selection transistor ST1 having a drain connected to a bit line, a selection transistor ST2 having a source connected to a source line, and a plurality of memory cell transistors MT having current paths connected in series between the source of the selection transistor ST1 and the drain of the selection transistor ST2.

In the conventional NAND flash memory described above, data is written by selecting a certain word line. This technique is described in, e.g., "Jpn. Pat. Appln. KOKAI Publication No. 2005-285184" or "SmartMedia™ (registered trademark) Physical Format Specification Ver 1.21, issued by SSFDC Forum Technical Meeting, May 19, 1999". However, this technique has the problem that the reliability of the system deteriorates due to the loss of important data.

BRIEF SUMMARY OF THE INVENTION

A memory controller according to the first aspect of the present invention which writes data in a first semiconductor memory including a plurality of memory cells, a first selection transistor, a second selection transistor, a first select gate line, a second select gate line and a plurality of word lines, the plurality of memory cells having current paths connected in series between a source of the first selection transistor and a drain of the second selection transistor, each of the plurality of memory cells having a control gate and a charge storage layer, the first and second select gate lines respectively connected to gates of the first and second selection transistors, and the plurality of word lines respectively connected to the control gates, the memory controller comprising a host interface which is configured to be connectable to a host apparatus and to be receivable of first data from the host apparatus, a second semiconductor memory which temporarily holds second data, and an arithmetic unit which generates the second data in accordance with a state of the first semiconductor memory, temporarily holds the second data in the second semiconductor memory, and writes, in the first semiconductor memory, the first data from the host interface and the second data held in the second semiconductor memory, wherein when writing the second data, the arithmetic unit does not select the word lines adjacent to the first select gate line and the second select gate line, and selects the word line not adjacent to the first select gate line and the second select gate line.

A memory controller according to the second aspect of the present invention which writes data in a first semiconductor memory including a plurality of memory cells, a first selection transistor, a second selection transistor, a first select gate line, a second select gate line and a plurality of word lines, the plurality of memory cells having current paths connected in series between a source of the first selection transistor and a drain of the second selection transistor, each of the plurality of memory cells having a control gate and a charge storage layer and being configured to hold data having at least two bits, the first and second select gate lines respectively connected to gates of the first and second selection transistors, and the plurality of word lines respectively connected to the control gates, the memory controller comprising a host interface which is configured to be connectable to a host apparatus and to be receivable of first data from the host apparatus, a second semiconductor memory which temporarily holds second data, and an arithmetic unit which generates the second data in accordance with a state of the first semiconductor memory, temporarily holds the second data in the second semiconductor memory, and writes, in the first semiconductor memory, the first data from the host interface and the second data held in the second semiconductor memory, wherein when writing the second data, the arithmetic unit writes one-bit data in the memory cells connected to the word lines adjacent to the first select gate line and the second select gate line, and writes the data having not less than two bits in the memory cell connected to the word line not adjacent to the first select gate line and the second select gate line.

DETAILED DESCRIPTION OF THE INVENTION

Figures 1, 2:
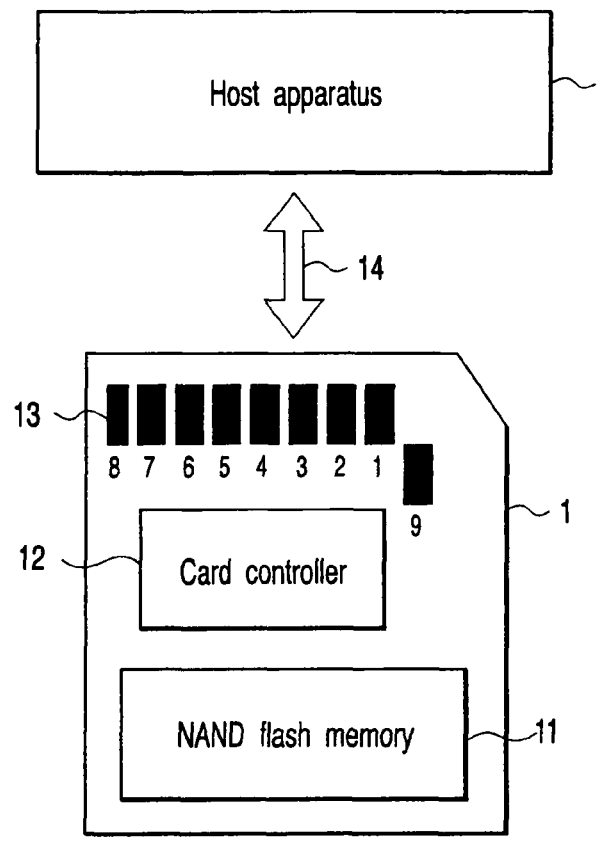
FIG. 1 is a block diagram of a memory system according to the first embodiment of the present invention.
FIG. 2 is a view showing the assignment of signals to signal pins in a memory card according to the first embodiment of the present invention.

Embodiments of the present invention will be explained below with reference to the accompanying drawing. In the following explanation, the same reference numerals denote the same parts throughout the drawing.

First Embodiment

A memory controller according to the first embodiment of the present invention will be explained below with reference to FIG. 1. FIG. 1 is a block diagram of a memory system according to this embodiment.

As shown in FIG. 1, this memory system comprises a memory card 1 and host apparatus 2. The host apparatus 2 has hardware and software for accessing the memory card 1 connected via a bus interface 14. The memory card 1 operates by receiving power supply when connected to the host apparatus 2, and performs processing corresponding to the access from the host apparatus 2.

The memory card 1 exchanges information with the host apparatus 2 via the bus interface 14. The memory card 1 includes a NAND flash memory chip (to be also simply referred to as a NAND flash memory or flash memory hereinafter) 11, a card controller 12 for controlling the flash memory chip 11, and signal pins (first to ninth pins) 13.

The signal pins 13 are electrically connected to the card controller 12. FIG. 2 shows an example of the assignment of signals to the first to ninth pins of the signal pins 13. FIG. 2 is a table showing the first to ninth pins and signals assigned to these pins.

Data 0, data 1, data 2, and data 3 are respectively assigned to the seventh, eighth, ninth, and first pins. The first pin is also assigned to a card detection signal. The second pin is assigned to a command. The third and sixth pins are assigned to a ground potential Vss. The fourth pin is assigned to a power supply potential Vdd. The fifth pin is assigned to a clock signal.

The memory card 1 can be inserted into and removed from a slot formed in the host apparatus 2. A host controller (not shown) of the host apparatus 2 communicates various signals and data with the card controller 12 in the memory card 1 via the first to ninth pins. When writing data in the memory card 1, for example, the host controller sends a write command as a serial signal to the card controller 12 via the second pin. The card controller 12 receives this write command input to the second pin, in response to the clock signal supplied to the fifth pin.

As described above, the write command is serially input to the card controller 12 by using only the second pin. As shown in FIG. 2, the second pin assigned to command input is positioned between the first pin for data 3 and the third pin for the ground potential Vss. The host controller in the host apparatus 2 and the memory card 1 communicate with each other by using the signal pins 13 and the bus interface 14 corresponding to them.

On the other hand, the flash memory 11 and card controller 12 communicate with each other by using a NAND flash memory interface. Although not shown, therefore, the flash memory 11 and card controller 12 are connected by, e.g., 8-bit input/output (I/O) lines.

When writing data in the flash memory 11, for example, the card controller 12 sequentially inputs a data input command 80H, column address, page address, data, and program command 10H to the flash memory 11 via the I/O lines. "H" of the command 80H indicates a hexadecimal number. In practice, an 8-bit signal "10000000" is supplied parallel to the 8-bit I/O lines. That is, this NAND flash memory interface supplies a multi-bit command parallel.

Also, the NAND flash memory interface communicates commands and data with the flash memory 11 by using the same I/O lines. As described above, the interface for communication between the host controller in the host apparatus 2 and the memory card 1 differs from the interface for communication between the flash memory 11 and card controller 12.

Figure 3:
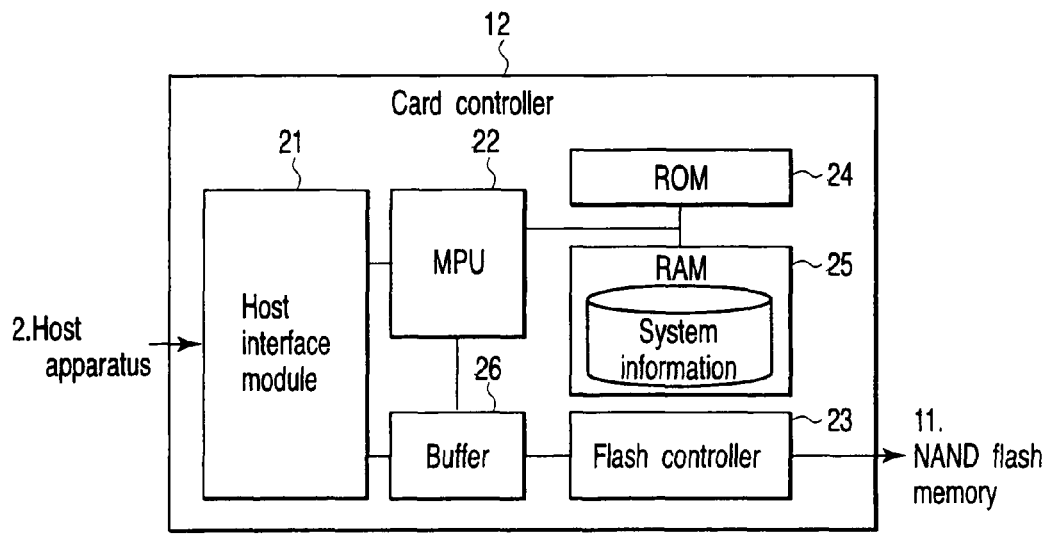
FIG. 3 is a block diagram of a card controller of the memory card according to the first embodiment of the present invention.

The internal arrangement of the card controller of the memory card 1 shown in FIG. 1 will be explained below with reference to FIG. 3. FIG. 3 is a block diagram of the card controller.

The card controller 12 manages the internal physical state (e.g., which physical block address contains what number of logical sector address data, or which block is erasable) of the flash memory 11. The card controller 12 has a host interface module 21, MPU (Micro Processing Unit) 22, flash controller 23, ROM (Read-Only Memory) 24, RAM (Random Access Memory) 25, and buffer 26.

The host interface module 21 interfaces the card controller 12 and host apparatus 2 with each other.

The MPU 22 controls the overall operation of the memory card 1. When power is supplied to the memory card 1, the MPU 22 reads out firmware (a control program) stored in the ROM 24 onto the RAM 25 and executes predetermined processing, thereby forming various tables on the RAM 25. One of these tables is system information. The RAM 25 is, e.g., a volatile semiconductor memory such as an SRAM. It is a matter of course that the RAM 25 may also be a nonvolatile memory. The system information relates to the NAND flash memory 11, and the details will be described later. Also, the MPU 22 receives a write command, read command, and erase command from the host apparatus 2, executes predetermined processing on the flash memory 11, and controls data transfer via the buffer 26.

The ROM 24 stores the control program controlled by the MPU 22. The RAM 25 is used as a work area of the MPU 22, and stores the control program and various tables. The flash controller 23 interfaces the card controller 12 and flash memory 11 with each other.

The buffer 26 temporarily stores a predetermined amount of data (e.g., one page) when writing data transmitted from the host apparatus 2 into the flash memory 11, and temporarily stores a predetermined amount of data when transmitting data read out from the flash memory 11 to the host apparatus 2.

Figure 4:
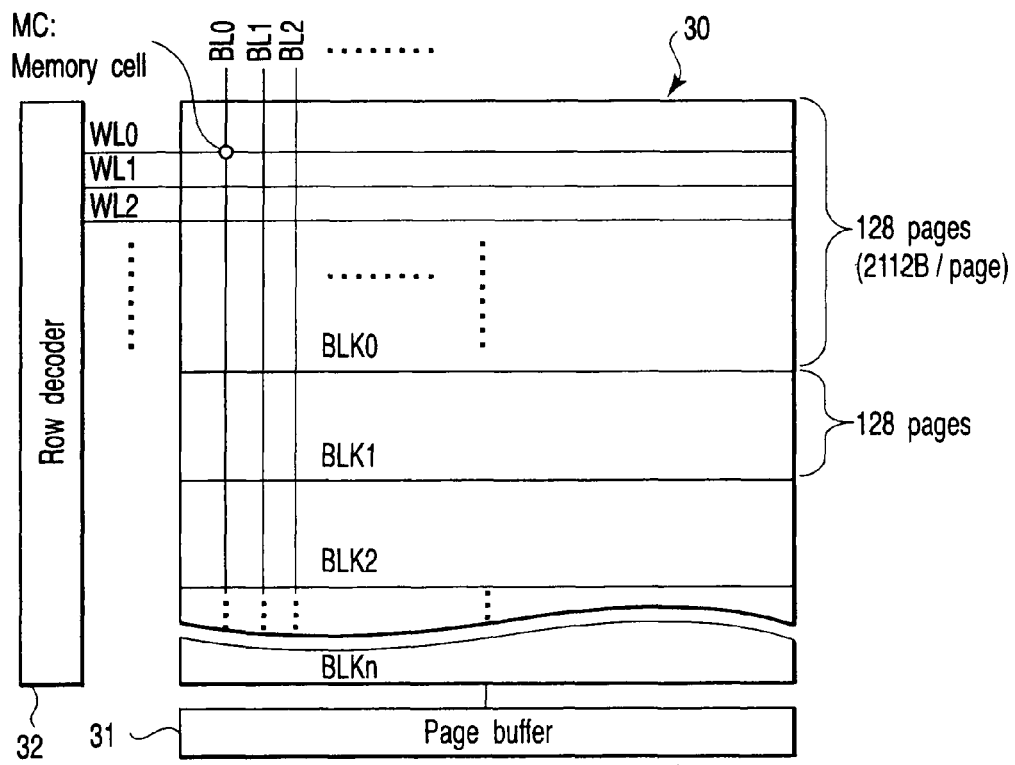
FIG. 4 is a block diagram of a flash memory according to the first embodiment of the present invention.

The internal arrangement of the NAND flash memory 11 will be briefly explained below. FIG. 4 is a block diagram of the NAND flash memory 11. As shown in FIG. 4, the NAND flash memory 11 comprises a memory cell array 30, page buffer 31, and row decoder 32.

The memory cell array 30 includes memory blocks BLK0 to BLKn (n is a natural number of 1 or more). Note that the memory blocks BLK0 to BLKn will also be simply referred to as memory blocks BLK hereinafter. Note also that data erase is performed for each memory block BLK. That is, data in one memory block BLK is erased at once. Each memory block BLK includes a plurality of memory cell transistors. The memory block BLK also has word lines WL0, WL1, ... (to be referred to as word lines WL hereinafter), and bit lines BL0, BL1, ... (to be referred to as bit lines BL hereinafter) perpendicular to the word lines WL. Memory cell transistors on the same row are connected together to the same word line. Memory cell transistors in the same column are connected, as sets each including a plurality of memory cell transistors, to the bit lines BL. Note that data write and read are performed for each set including a plurality of memory cell transistors, and this memory cell transistor set is called a page. When reading out and writing data, a certain world line WL is selected by a row address, and a certain bit line BL is selected by a column address. In the example shown in FIG. 4, each page of the flash memory 11 has 2,112 bytes (512-byte data storage portion×4+10-byte redundancy portion×4+24-byte management data storage portion), and each memory block BLK contains, e.g., 128 pages.

The page buffer 31 performs data input/output with respect to the flash memory 11, and temporarily holds data. The page buffer 31 can hold a data size of 2,112 bytes (2,048 bytes +64 bytes) that is the same as the page size of each memory block BLK. When writing data, for example, the page buffer 31 executes the data input/output process with respect to the flash memory 11, for each page corresponding to its own storage capacity.

When writing and reading out data, the row decoder 32 selects a certain word line WL.

Figure 5:
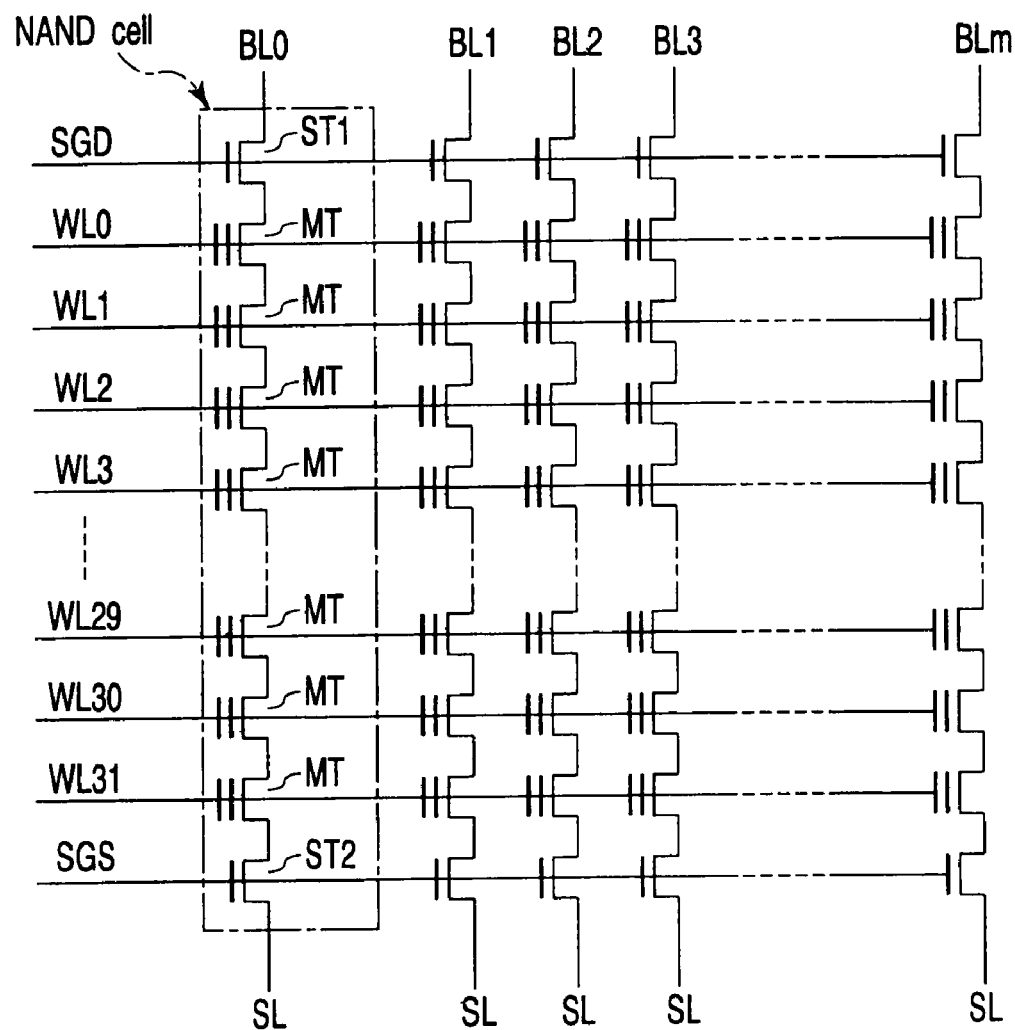
FIG. 5 is a circuit diagram of a memory block of the flash memory according to the first embodiment of the present invention.

Details of the arrangement of the memory block will be explained below with reference to FIG. 5. FIG. 5 is an equivalent circuit diagram of a certain memory block BLK.

As shown in FIG. 5, the memory block BLK comprises (m+1) NAND cells (m is a natural number of 1 or more) arranged in the direction of the word lines WL. Each NAND cell comprises selection transistors ST1 and ST2, and 32 memory cell transistors MT. The selection transistors ST1 of these NAND cells have drains connected to bit lines BL0 to BLm, and gates connected together to a select gate line SGD. The selection transistors ST2 have sources connected to source lines SL, and gates connected together to a select gate line SGS.

Each memory cell transistor MT is a MOS transistor having a stacked gate formed on a semiconductor substrate via a gate insulating film. The stacked gate includes a charge storage layer (floating gate) formed on the gate insulating film, and a control gate formed on the charge storage layer via an inter-gate insulating film. In each NAND cell, the 32 memory cell transistors MT are arranged such that their current paths are connected in series, between the source of the selection transistor ST1 and the drain of the selection transistor ST2. The control gates of the memory cell transistors MT are connected to word lines WL0 to WL31 in order from the memory cell transistor MT closest to the drain side. Accordingly, the drain of the memory cell transistor MT connected to the word line WL0 is connected to the source of the selection transistor ST1, and the source of the memory cell transistor MT connected to the word line WL31 is connected to the drain of the selection transistor ST2.

The word lines WL0 to WL31 connect the control gates of the memory cell transistors MT together between the NAND cells in the memory block. That is, the control gates of the memory cell transistors MT on the same row in the memory block BLK are connected to the same word line WL. Also, the bit lines BL0 to BLm connect the drains of the selection transistors ST1 together between the memory blocks. That is, the NAND cells in the same column in a plurality of memory blocks BLK are connected to the same bit line BL.

Figure 6:
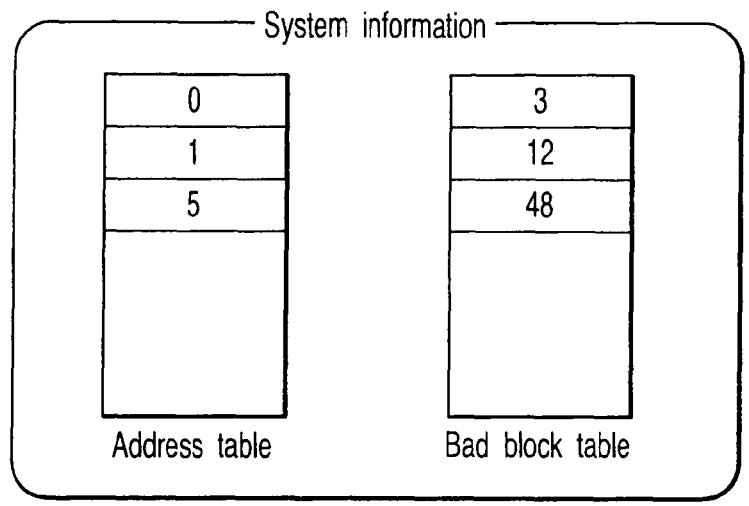
FIG. 6 is a conceptual view of system information of the card controller according to the first embodiment of the present invention.

The system information shown in FIG. 3 will be explained below with reference to FIG. 6. FIG. 6 is a conceptual view showing an example of the system information held in the RAM 25.

As shown in FIG. 6, the system information contains an address table and bad block table.

The address table shows the correspondence between a logical address and physical address. The logical address is used when the host apparatus 2 accesses the memory card 1. The physical address indicates a physical position in the memory cell array 30 of the NAND flash memory 11. The logical address and physical address do not always match. Therefore, the MPU 22 holds the correspondence between the logical and physical addresses as the address table in the RAM 25. In this example of the address table shown in FIG. 6, an entry to which each physical block address is allocated holds a corresponding logical block address. In the case shown in FIG. 6, logical block addresses "0", "1", and "5" are held in this order from the first entry, so physical block addresses "0", "1", and "2" respectively correspond to the logical block addresses "0", "1", and "5".

The bad block table will be explained next. If a defect or the like makes a certain memory block unusable in the NAND flash memory 11, the MPU 22 must grasp this memory block. Therefore, the MPU 22 holds an unusable memory block as a bad block table in the RAM 25. In the example shown in FIG. 6, the use of memory blocks BLK3, BLK12, and BLK48 is inhibited.

These pieces of system information are temporarily stored in the RAM 25, and written in the NAND flash memory 11 at a predetermined timing.

Figure 7:
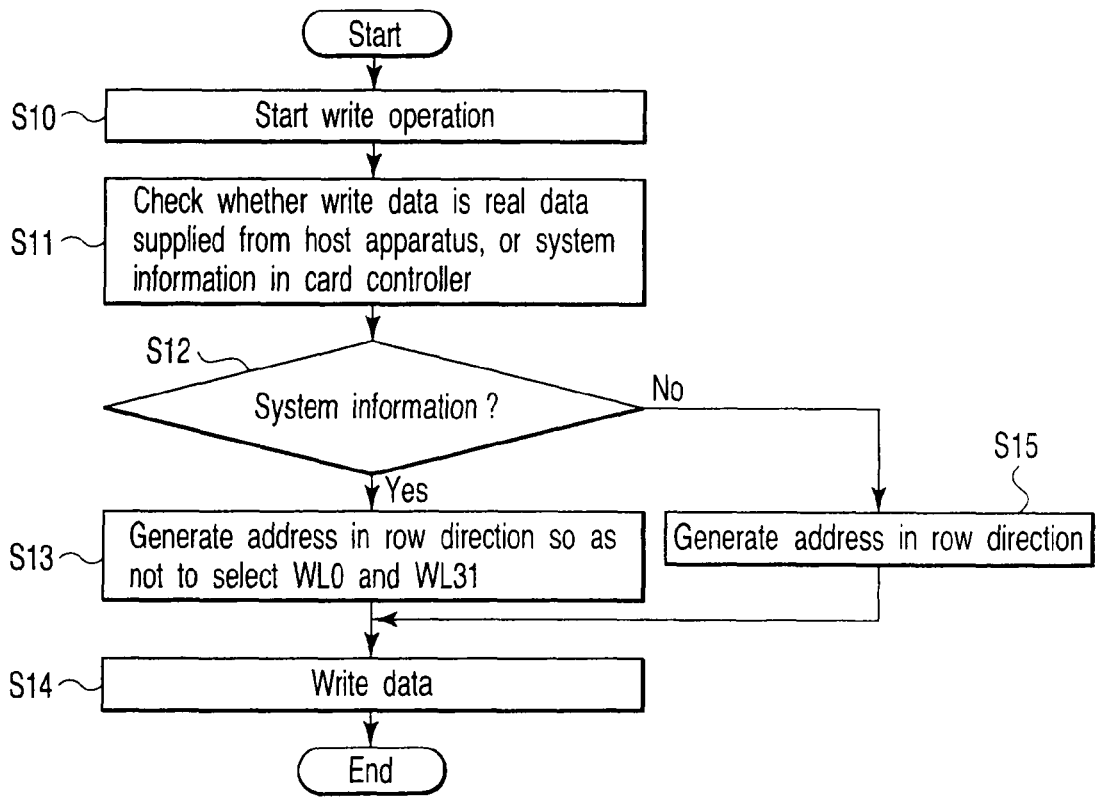
FIG. 7 is a flowchart showing the processing of a write operation of the card controller according to the first embodiment of the present invention.

A data write method of the memory system described above will be explained below with reference to FIG. 7. FIG. 7 is a flowchart showing the processing of the card controller 12 when writing data.

When the card controller 12 starts a write operation (step S10), the MPU 22 first checks whether data to be written is real data supplied from the host apparatus 2 or the system information held in the card controller 12, for example, the RAM 25 (step S11). If the data is the system information (YES in step S12), the MPU 22 generates an address in the row direction so as not to select the word lines WL0 and WL31 (step S13). More specifically, the MPU 22 first generates a block address so as to select a certain memory block. The MPU 22 also generates a page address to select a certain page. In this case, the MPU 22 generates a page address corresponding to not the word lines WL0 and WL31 but the word lines WL1 to WL30. Subsequently, the flash controller 23 generates a row address on the basis of the block address and page address generated by the MPU 22. In addition, the MPU 22 supplies a write instruction and the system information to the NAND flash memory 11 via the flash controller 23, and the flash controller 23 supplies the row address to the NAND flash memory 11, thereby writing the data (step S14).

In the NAND flash memory 11, the row decoder 32 selects one of the word lines WL1 to WL30 on the basis of the row address, and a write circuit (not shown) supplies the system information to each bit line. Consequently, the system information is written in the memory cell transistor MT connected to one of the word lines WL1 to WL30.

If the MPU 22 determines in step S12 that the data is not the system information (NO in step S12), the MPU 22 performs a normal write operation. That is, the MPU 22 generates an address in the row direction to select one of the word lines WL0 to WL31 including the word lines WL0 and WL31 (step S15). That is, the MPU 22 generates a page address corresponding to one of the word lines WL0 to WL31. After that, the data is written in step S14.

As described above, the memory system according to the first embodiment of the present invention achieves effect (1) below.

(1) The system reliability can improve (No. 1).

Figure 8:
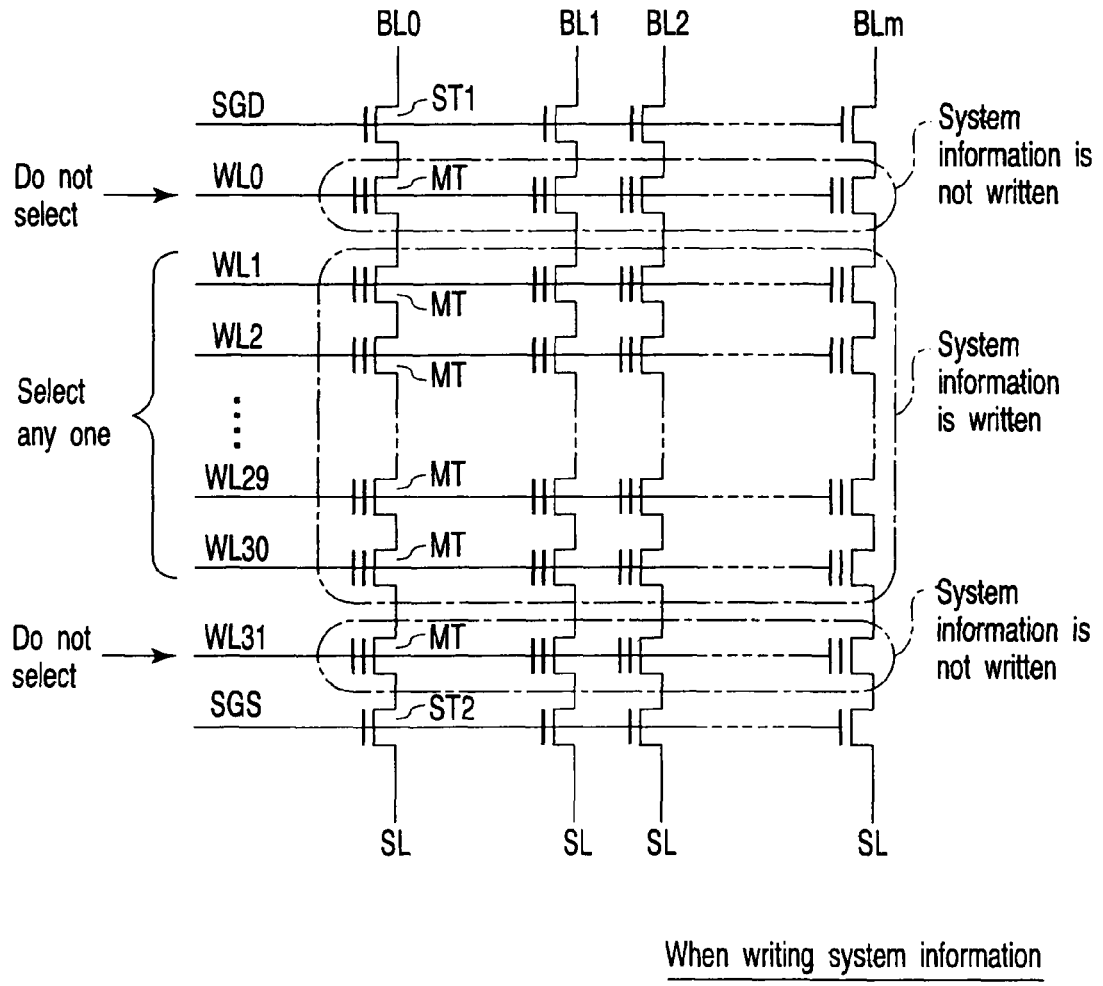
FIG. 8 is a circuit diagram of the memory block of the flash memory according to the first embodiment of the present invention, which shows the way the system information is written.

FIG. 8 is a circuit diagram of the memory block BLK of the flash memory 11 according to this embodiment, and shows the way the system information is written.

In the memory system according to this embodiment as shown in FIG. 8, the card controller 12 writes the system information in the memory cell transistors MT connected to the word lines WL1 to WL30, and does not write any system information in the memory cell transistors MT connected to the word lines WL0 and WL31. In other words, when writing the system information, the card controller 12 does not select the word lines WL0 and WL31 adjacent to the select gate lines SGD and SGS, and selects the word lines WL1 to WL30 not adjacent to the select gate lines SGD and SGS.

In the conventional device, one of the word lines WL0 to WL31 is selected regardless of the type of data to be written. Accordingly, the word lines WL0 and WL31 adjacent to the select gate lines may be selected even when writing not only normal data supplied from the host apparatus but also data such as the system information that is important for the system to operate. However, the regularity of the arrangement of the word lines WL breaks in regions where the select gate lines SGD and SGS are formed in the memory block BLK. From the viewpoint of the semiconductor device fabrication process, therefore, defects such as bit errors readily occur on the word lines WL adjacent to the select gate lines SGD and SGS. Consequently, the system reliability deteriorates if data requiring reliability (i.e., data such as the system information required for the system to operate) is written in the memory cell transistors MT connected to the word lines adjacent to the select gate lines SGD and SGS.

When writing data requiring reliability, however, this embodiment selects word lines except for the word lines that readily cause defects, thereby preventing the loss of the data. As a consequence, the reliability of the memory system can improve.

Second Embodiment

Figure 9:
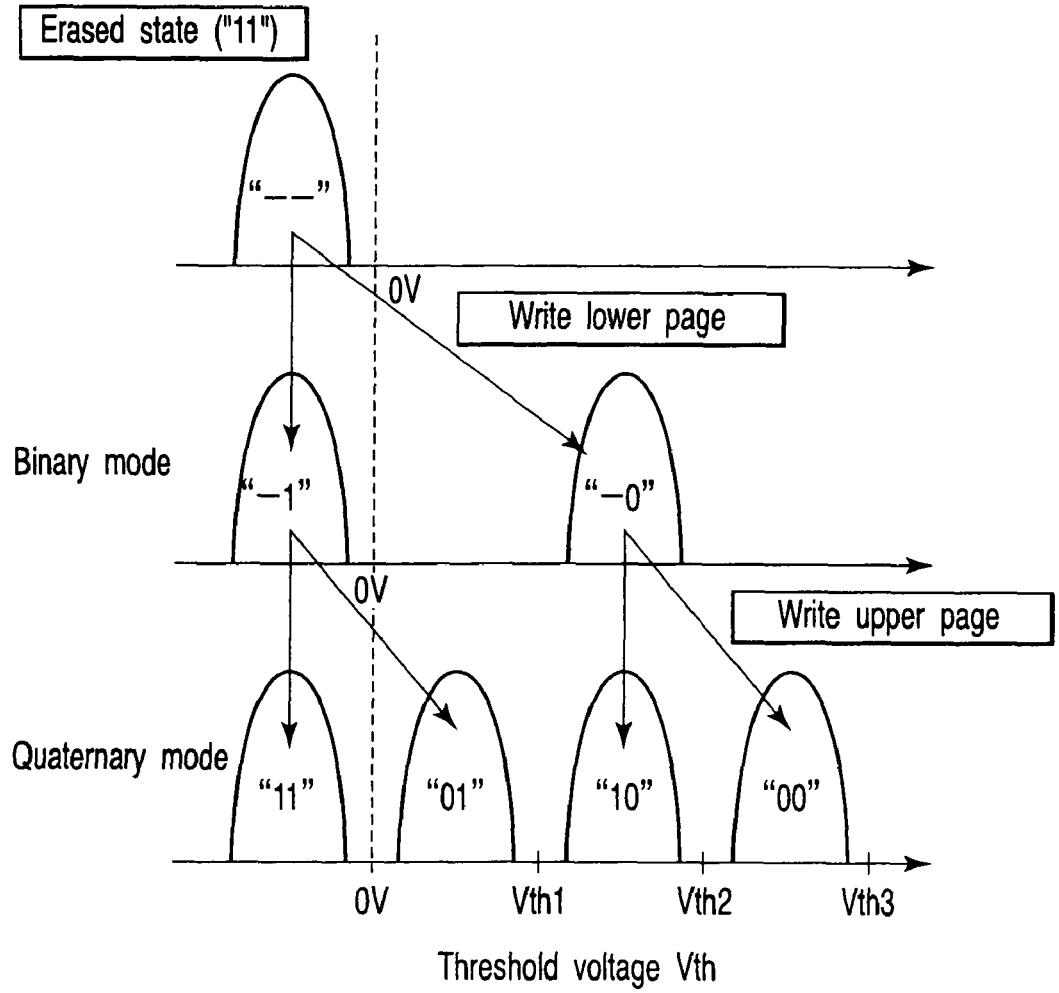
FIG. 9 is a graph showing the threshold distribution of a flash memory according to the second embodiment of the present invention.

A memory controller according to the second embodiment of the present invention will be explained below. When writing data requiring reliability in a multilevel NAND flash memory, this embodiment writes the data in a binary mode when selecting word lines adjacent to select gate lines SGD and SGS. Note that the configuration of a memory system is the same as the first embodiment described above, so a repetitive explanation will be omitted. FIG. 9 is a graph showing the threshold distribution of a memory cell transistor MT in a NAND flash memory 11 according to this embodiment.

The NAND flash memory 11 according to this embodiment holds data having two bits or more. This flash memory will also be referred to as a multilevel NAND flash memory hereinafter. In this embodiment, the multilevel NAND flash memory 11 can hold 2-bit data. A mode in which 2-bit data is written in each memory cell transistor MT will be called a quaternary mode (or multilevel mode). A mode in which 1-bit data is written in each memory cell transistor MT will be called a binary mode. Referring to FIG. 9, the abscissa indicates a threshold voltage Vth, and the ordinate indicates the memory cell existence probability.

First, the quaternary mode will be explained. As shown in FIG. 9, the memory cell transistor can hold four data "11", "01", "10", and "00" in ascending order of a threshold voltage Vth. The threshold voltage Vth of a memory cell transistor holding the data "11" is Vth<0V. The threshold voltage Vth of a memory cell transistor holding the data "01" is 0V<Vth<Vth1. The threshold voltage Vth of a memory cell transistor holding the data "10" is Vth1<Vth<Vth2. The threshold voltage Vth of a memory cell transistor holding the data "00" is Vth2<Vth<Vth3.

Next, the binary mode will be explained. As shown in FIG. 9, the memory cell transistor can hold two data "1" and "0" in ascending order of the threshold voltage Vth. The threshold voltage Vth of a memory cell transistor holding the data "1" is Vth<0V. The threshold voltage Vth of a memory cell transistor holding the data "0" is Vth1<Vth<Vth2. That is, the data "1" has a threshold voltage equal to that of the data "11" in the quaternary mode, and the data "0" has a threshold voltage equal to that of the data "10" in the quaternary mode.

In other words, the binary mode is an operation mode using only the lower bit of the 2-bit data in the quaternary mode. A card controller 12 controls whether to write data in the memory cell transistor in the binary mode or quaternary mode.

Data is written from the lower bit. Assuming that an erased state is "11" ("--", - means indefinite), the memory cell transistor MT holds "11" ("-1") or "10" ("-0") when the lower bit is written. Data write in the binary mode is complete in this state. When writing data in the quaternary mode, the upper bit is then written. As a consequence, the memory cell transistor MT holding "11" ("-1") holds "11" or "01", and the memory cell transistor MT holding "10" ("-0") holds "10" or "00".

Figure 10:
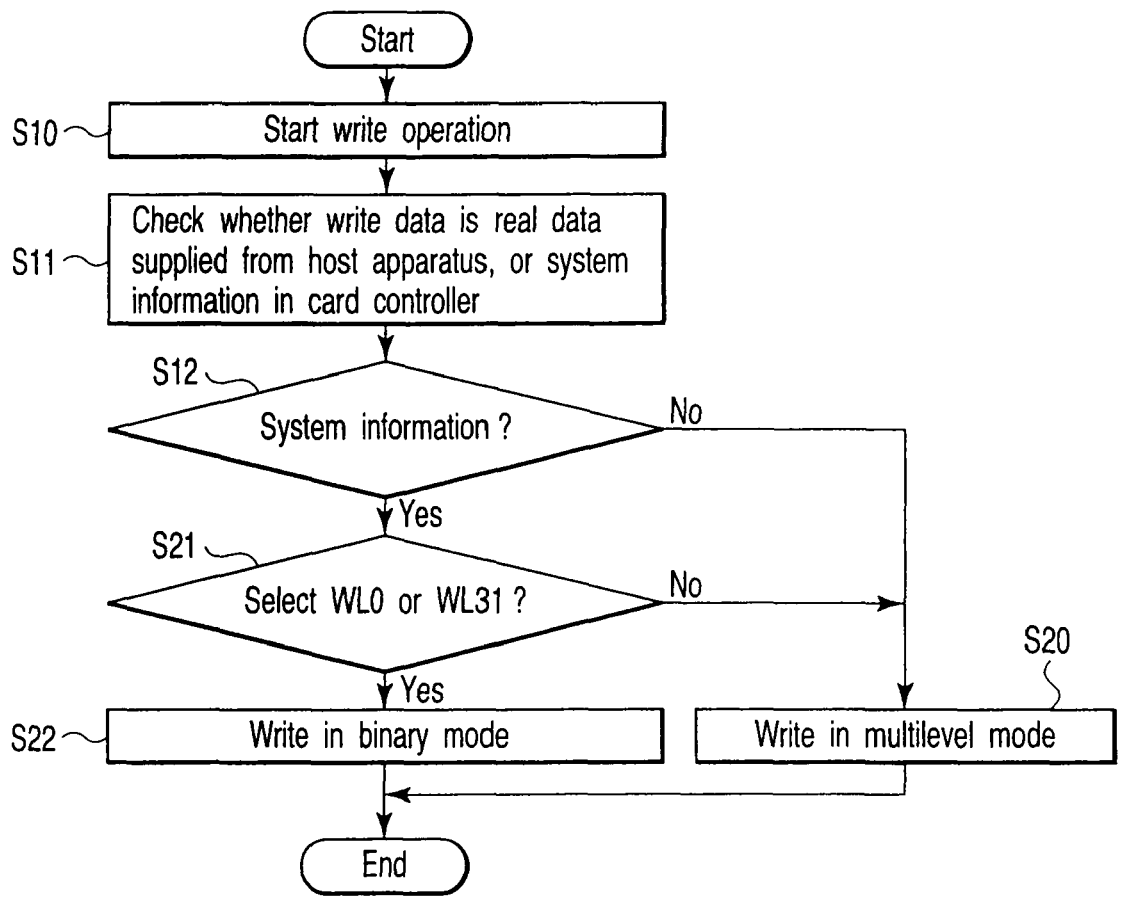
FIG. 10 is a flowchart showing the processing of a write operation of a card controller according to the second embodiment of the present invention.

A data write method of the memory system described above will be explained below with reference to FIG. 10. FIG. 10 is a flowchart showing the processing of the card controller 12 when writing data.

Processing up to step S11 is the same as in the first embodiment. If data to be written is not the system information (NO in step S12), an MPU 22 of the card controller 12 writes the data in any of word lines WL0 to WL31 in the multilevel mode (in this embodiment, the quaternary mode) (step S20). If the data is the system information (YES in step S12) and the word line WL0 or WL31 is to be selected (YES in step S21), the MPU 22 of the card controller 12 writes the data in the binary mode (step S22). On the other hand, if the word lines WL0 and WL31 are not to be selected (NO in step S21), the MPU 22 writes the data in the multilevel mode (step S20).

As described above, the memory system according to the second embodiment of the present invention achieves effect (2) below.

(2) The system reliability can improve (No. 2).

Figure 11:
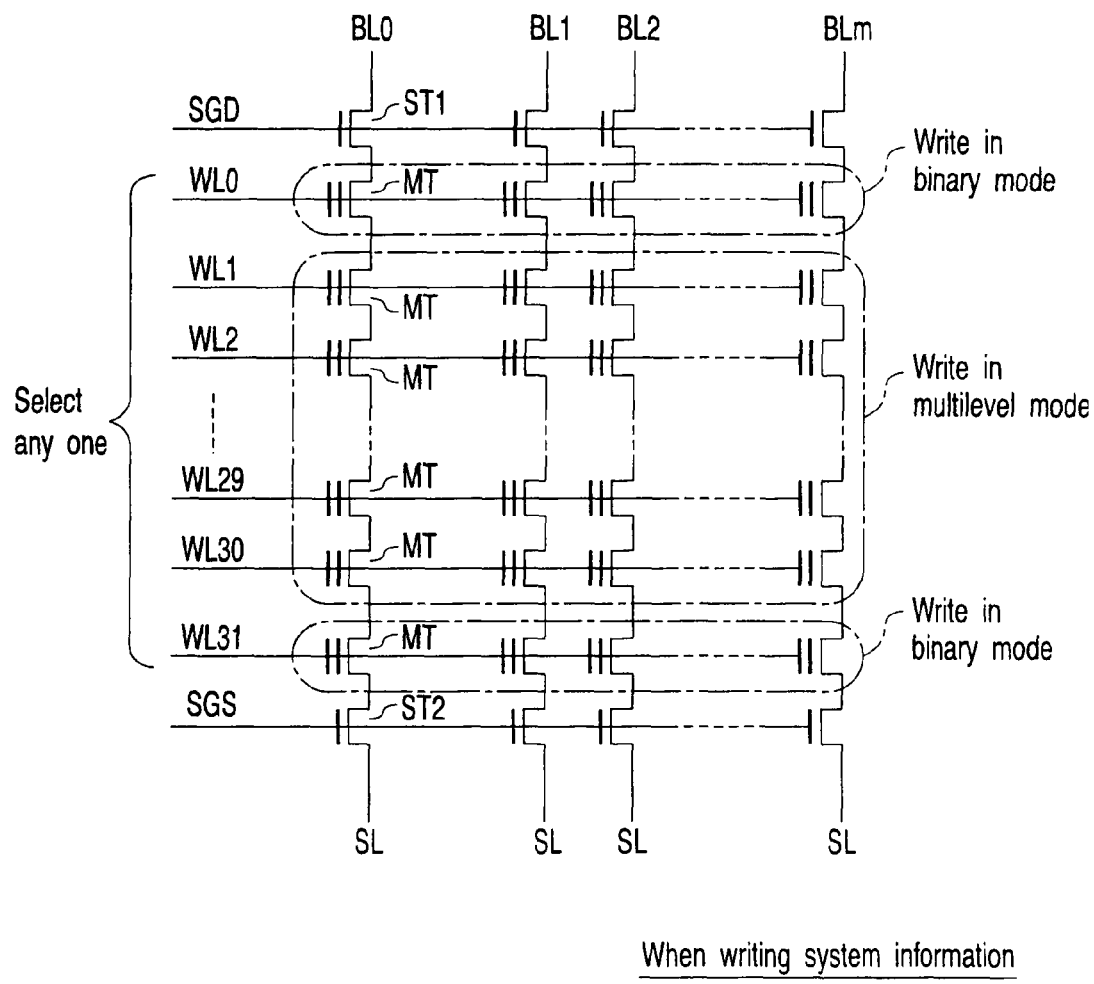
FIG. 11 is a circuit diagram of a memory block of the flash memory according to the second embodiment of the present invention, which shows the way the system information is written.

FIG. 11 is a circuit diagram of a memory block BLK of the flash memory 11 according to this embodiment, and shows the way the system information is written.

As shown in FIG. 11, when writing the system information in the NAND flash memory 11, the card controller 12 writes the system information in the multilevel mode when selecting the word lines WL1 to WL30, and writes the system information in the binary mode when selecting the word lines WL0 and WL31. In other words, when writing the system information, the card controller 12 uses the binary mode when selecting the word lines WL0 and WL31 adjacent to the select gate lines SGD and SGS, and uses the multilevel mode when selecting the word lines WL1 to WL30 not adjacent to the select gate lines SGD and SGS.

As explained with reference to FIG. 9, the threshold voltage difference between data is larger in the binary mode than in the quaternary mode. Also, the stress given to the memory cell transistor MT by a write operation is smaller in the binary mode than in the quaternary mode. When written in the binary mode, therefore, the system information can be accurately held even when using the word lines WL0 and WL31 that readily cause bit errors. As a consequence, the reliability of the memory system can improve.

Note that this embodiment has explained that the binary mode is the operation mode using the lower bit in the quaternary mode. However, the binary mode may also be an operation mode using the upper bit in the quaternary mode. It is possible to selectively use the two operation modes in accordance with, e.g., the data holding characteristic or threshold setting method.

Figure 12:
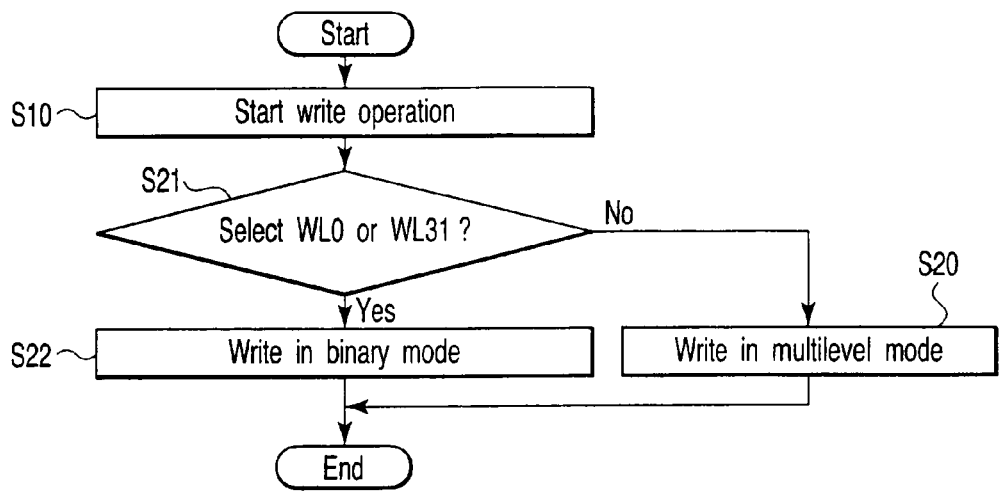
FIG. 12 is a flowchart showing the processing of a write operation of a card controller according to a modification of the second embodiment of the present invention.

The above embodiment has explained the case that the binary mode is applied only when writing the system information in the word lines WL0 and WL31. However, the binary mode can also be applied to write normal data supplied from a host apparatus 2 into the word lines WL0 and WL31. FIG. 12 is a flowchart showing the processing of the card controller 12 in this case. As shown in FIG. 12, the sequence of this processing is obtained by omitting steps S11 and S12 in FIG. 10. That is, the card controller 12 first determines whether to select the word line WL0 or WL31. Then, regardless of the type of data, the card controller 12 writes the data in the binary mode (step S22) if the word line WL0 or WL31 is to be selected (YES in step S21), or writes the data in the quaternary mode if the word lines WL0 and WL31 are not to be selected (NO in step S21). This method can assure the reliability of normal data as well.

Third Embodiment

Figure 13:
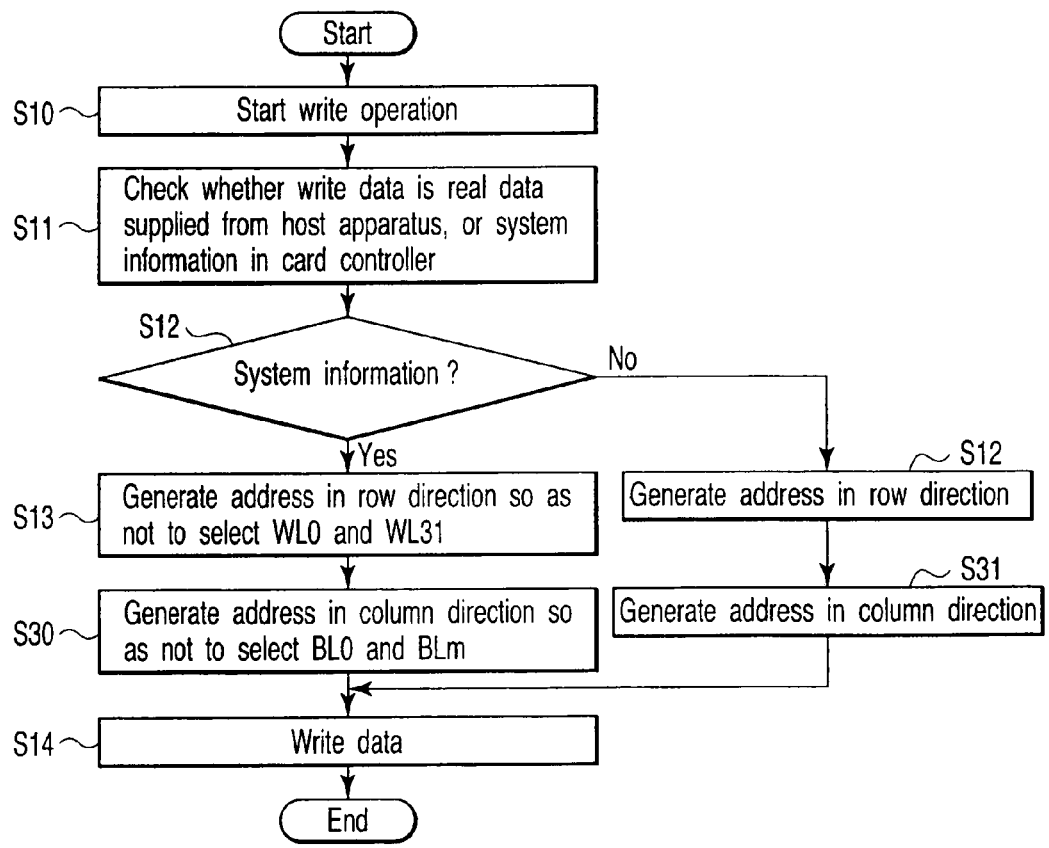
FIG. 13 is a flowchart showing the processing of a write operation of a card controller according to the third embodiment of the present invention.

A memory controller according to the third embodiment of the present invention will be explained below. This embodiment takes account of bit lines as well in the first embodiment described previously. The configuration of a memory system is almost the same as the first embodiment except that a NAND flash memory 11 has a column decoder for selecting bit lines. FIG. 13 is a flowchart showing the processing of a card controller 12 when writing data.

Processing up to step S11 is the same as in the first embodiment. If data is the system information (YES in step S12), an MPU 22 generates an address in the row direction so as not to select word lines WL0 and WL31 (step S13). Subsequently, the MPU 22 generates an address in the column direction so as not to select bit lines BL0 and BLm (step S30). That is, the MPU 22 selects a column in a memory block BLK selected by a block address so as not to select bit lines positioned at the end portions; the MPU 22 generates a column address so as to select bit lines BL1 to BL(m−1). A row decoder 32 of the flash memory 11 receives the row address generated in step S13, and the column decoder receives the column address generated in step S30. The MPU 22 writes the system information in a memory cell transistor connected to a word line selected by the row decoder 32 and a bit line selected by the column decoder (step S14).

If the MPU 22 determines in step S12 that the data is not the system information (NO in step S12), the MPU 22 performs a normal write operation. That is, the MPU 22 generates an address in the row direction so as to select one of the word line WL0, word lines WL1 to WL30, and the word line WL31 (step S15). That is, the MPU 22 generates a page address corresponding to one of the word lines WL0 to WL31. Subsequently, the MPU 22 generates a column address so as to select one of the bit lines BL0 to BLm including the bit lines BL0 and BLm (step S31). After that, the MPU 22 writes the data in step S14.

As described above, the memory system according to the third embodiment of the present invention achieves effect (3) below in addition to effect (1) explained in the first embodiment.

(3) The system reliability can improve (No. 3).

Figure 14:
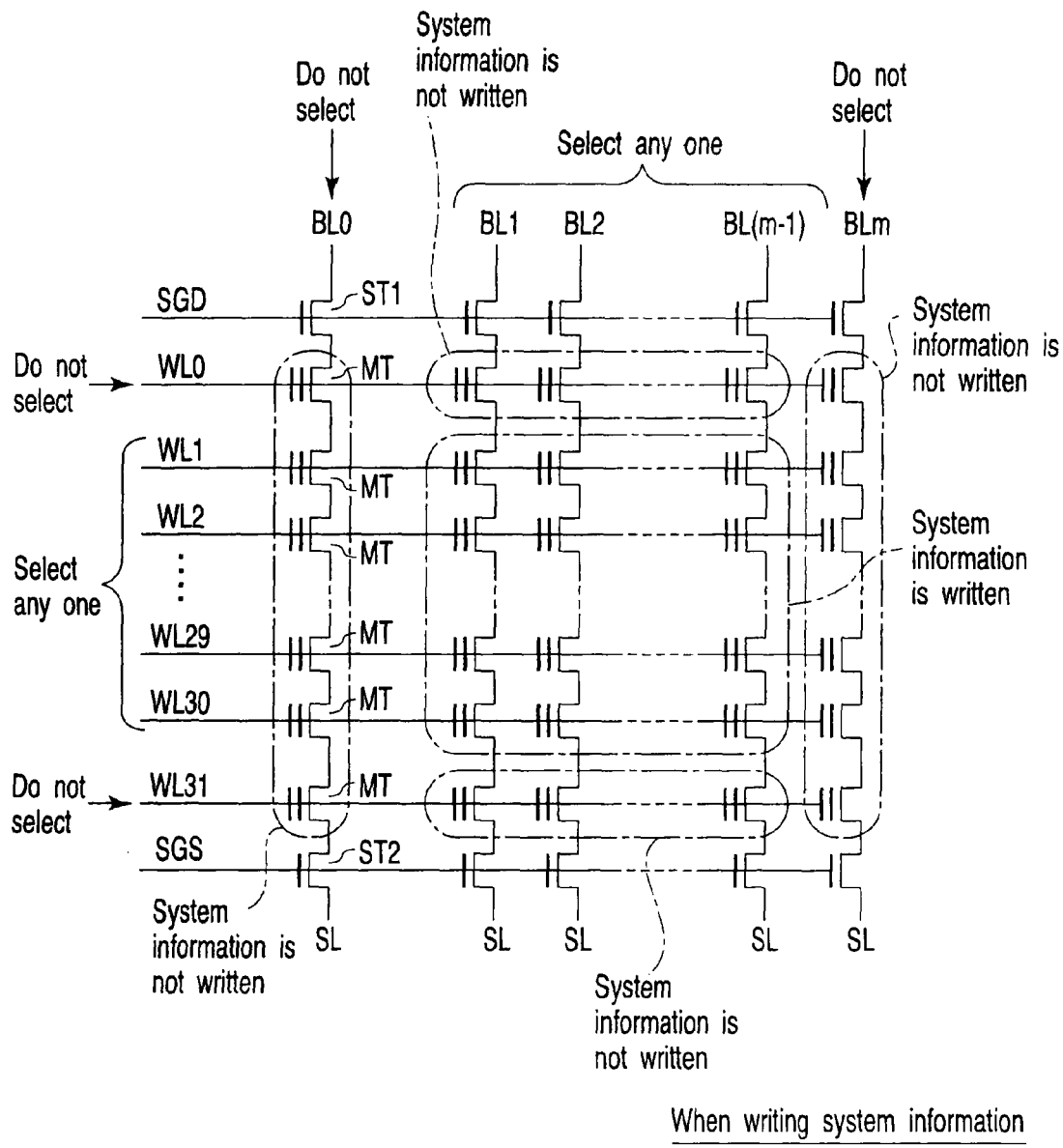
FIG. 14 is a circuit diagram of a memory block of a flash memory according to the third embodiment of the present invention, which shows the way the system information is written.

FIG. 14 is a circuit diagram of the memory block BLK of the flash memory 11 according to this embodiment, and shows the way the system information is written.

In the memory system according to this embodiment as shown in FIG. 14, the card controller 12 writes the system information in memory cell transistors MT connected to the word lines WL1 to WL30 and bit lines BL1 to BL(m−1), and does not write any system information in memory cell transistors MT connected to the word lines WL0 and WL31 and bit lines BL0 and BLm. In other words, when writing the system information, the card controller 12 does not select the word lines WL0 and WL31 adjacent to select gate lines SGD and SGS, and selects the word lines WL1 to WL30 not adjacent to the select gate lines SGD and SGS. In addition, the card controller 12 does not select the bit lines BL0 and BLm positioned at the end portions in the memory block BLK, and selects the bit lines BL1 to BL(m−1) not positioned at these end portions.

Similar to the word lines, the regularity of the arrangement of the bit lines BL breaks in a region at each end portion in the direction of the word lines in the memory block BLK. That is, in this region, another bit line exists on only one adjacent side in the direction of the word lines. Accordingly, from the viewpoint of the semiconductor device fabrication process, defects such as bit errors readily occur in this region.

By contrast, when writing data requiring reliability, this embodiment selects a bit line except for bit lines that readily cause defects. This makes it possible to improve the reliability of the memory system.

Fourth Embodiment

Figure 15:
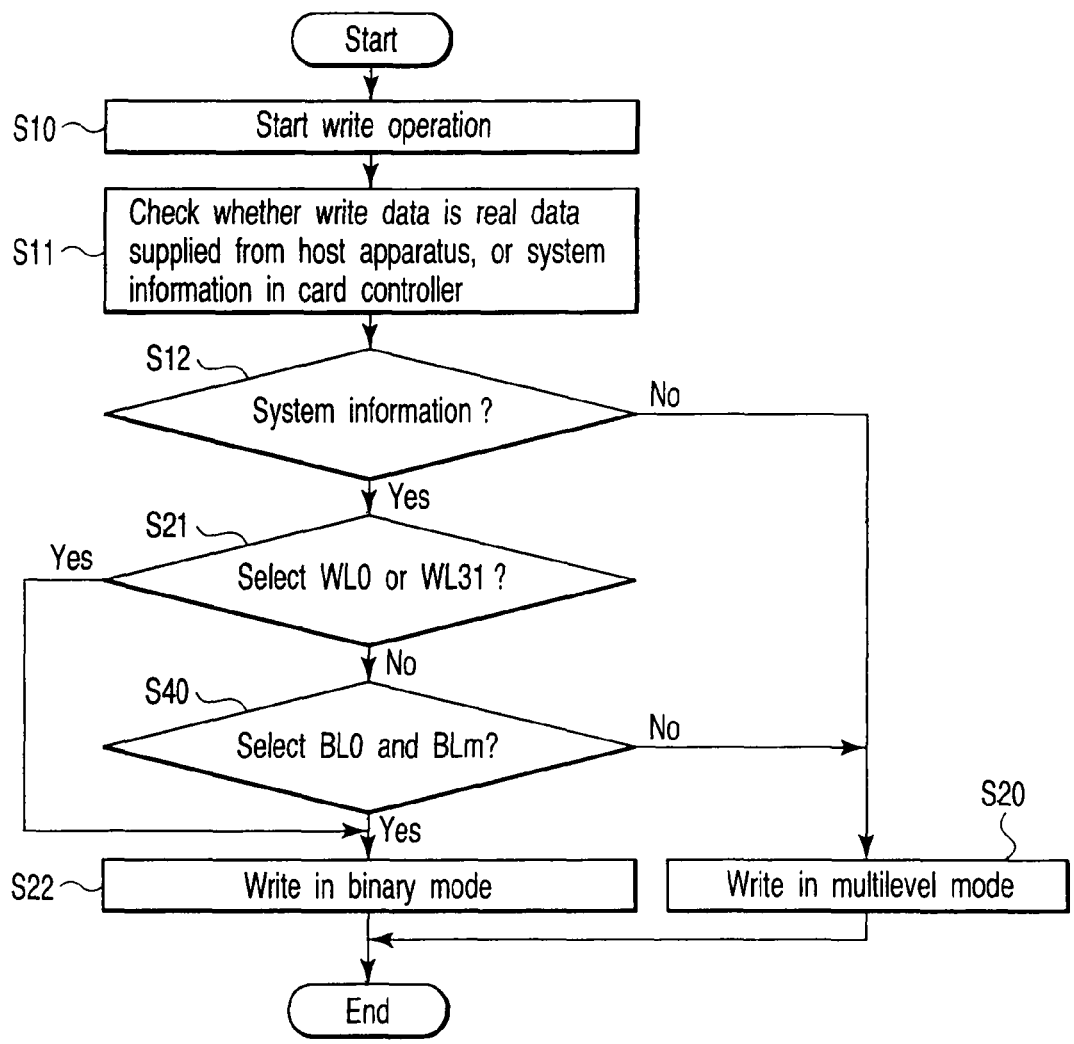
FIG. 15 is a flowchart showing the processing of a write operation of a card controller according to the fourth embodiment of the present invention.

A memory controller according to the fourth embodiment of the present invention will be explained below. This embodiment is a combination of the second and third embodiments described above. That is, when writing data requiring reliability in a multilevel NAND flash memory, the data is written in a binary mode when selecting word lines adjacent to select gate lines SGD and SGS and bit lines positioned at the end portions of a memory block BLK. FIG. 15 is a flowchart showing the processing of a card controller 12 when writing data.

Processing up to step S21 is the same as in the second embodiment. If word lines WL0 and WL31 are selected (YES in step S21), the system information is written in the binary mode in the same manner as in the second embodiment (step S22). If the word lines WL0 and WL31 are not selected (NO in step S21) and bit lines BL0 and BLm are selected (YES in step S40), the system information is similarly written in the binary mode (step S22). If the word lines WL0 and WL31 are not selected (NO in step S21) and the bit lines BL0 and BLm are not selected either (NO in step S40), the system information is written in a multilevel mode (step S20).

As described above, the memory system according to the fourth embodiment of the present invention achieves effect (4) below in addition to effect (2) explained in the second embodiment.

(4) The system reliability can improve (No. 4).

Figure 16:
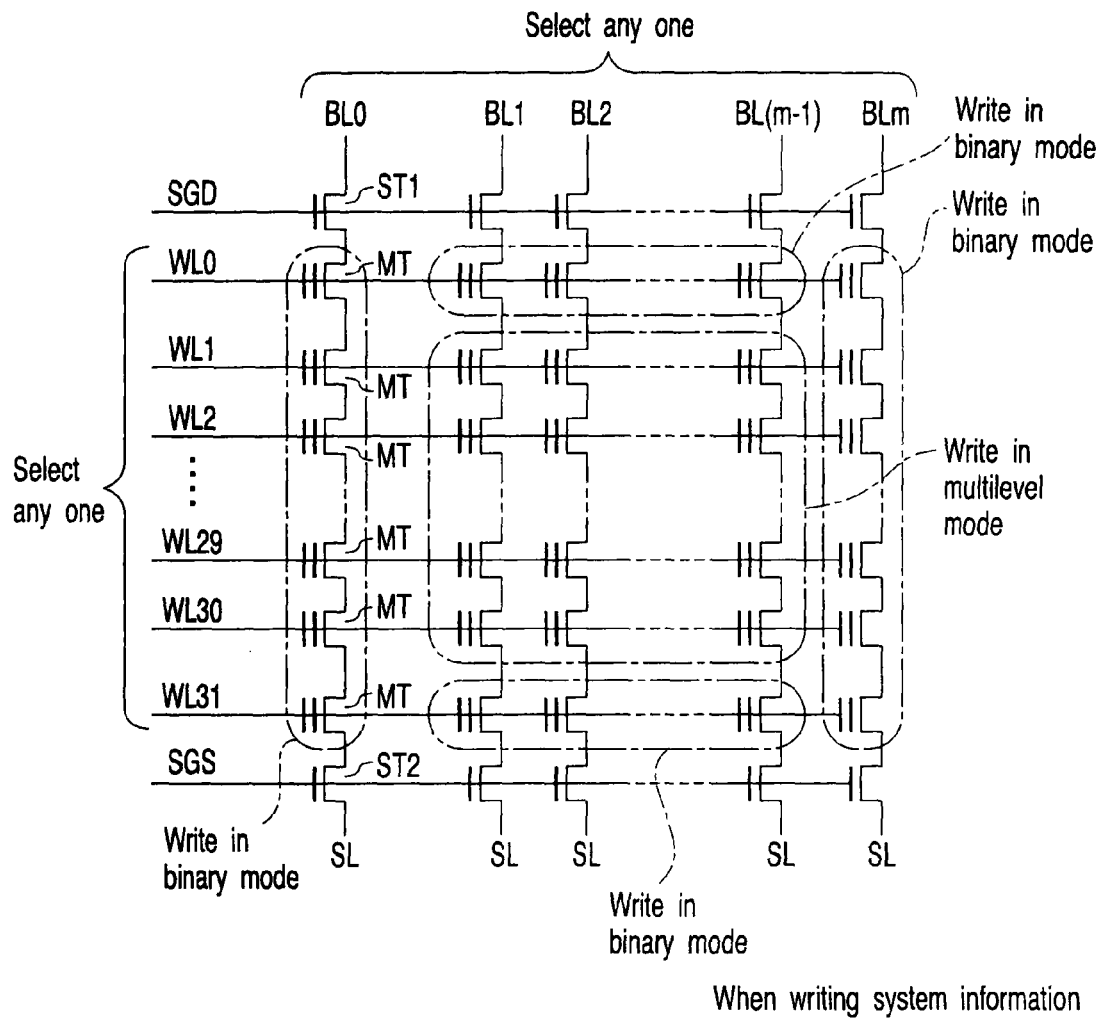
FIG. 16 is a circuit diagram of a memory block of a flash memory according to the fourth embodiment of the present invention, which shows the way the system information is written.

FIG. 16 is a circuit diagram of the memory block BLK of a flash memory 11 according to this embodiment, and shows the way the system information is written.

In the memory system according to this embodiment as shown in FIG. 16, when writing the system information in the NAND flash memory 11, the card controller 12 writes the system information in the multilevel mode when selecting word lines WL1 to WL30 and bit lines BL1 to BL(m−1), and writes the system information in the binary mode when selecting the word lines WL0 and WL31 and bit lines BL0 and BLm. In other words, when writing the system information, the card controller 12 uses the binary mode when selecting the word lines WL0 and WL31 adjacent to the select gate lines SGD and SGS and the bit lines BL0 and BLm at the memory block end portions, and the multilevel mode when selecting the word lines WL1 to WL30 not adjacent to the select gate lines SGD and SGS and the bit lines BL1 to BLm not at the memory block end portions.

As explained in the second embodiment, therefore, when written in the binary mode, the system information can be accurately held even when using the word lines WL0 and WL31 and bit lines BL0 and BLm that readily cause bit errors. As a consequence, the reliability of the memory system can improve.

It is a matter of course that the binary mode may also be an operation mode using the upper bit in the quaternary mode in this embodiment as well. Also, the binary mode can be applied to write normal data supplied from a host apparatus 2 into the word lines WL0 and WL31 and bit lines BL0 and BLm.

Fifth Embodiment

Figures 17, 18:
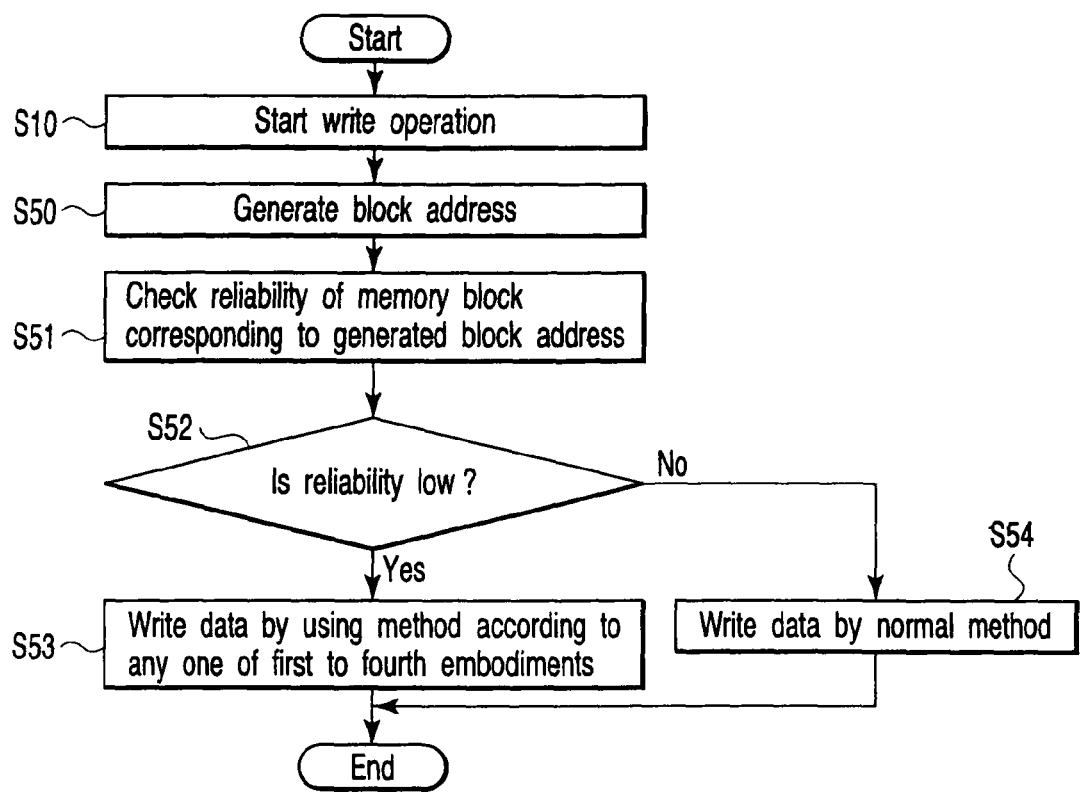
FIG. 17 is a flowchart showing the processing of a write operation of a card controller according to the fifth embodiment of the present invention.
FIG. 18 is a conceptual view of an error table of the card controller according to the fifth embodiment of the present invention.

A memory controller according to the fifth embodiment of the present invention will be explained below. This embodiment is directed to a method of determining whether to apply the first to fourth embodiments described above. The configuration of a memory system is the same as the first to fourth embodiments, so a repetitive explanation will be omitted. FIG. 17 is a flowchart of a data write method of a card controller 12.

As shown in FIG. 17, an MPU 22 starts a write operation (step S10), generates a block address (step S50), and checks the reliability of a memory block corresponding to the generated block address (step S52). The reliability herein mentioned relates to the data holding characteristic. If the MPU 22 determines that the reliability is low (YES in step S52), the MPU 22 writes data by using the method according to one of the first to fourth embodiments described above (step S53). If the MPU 22 determines that the reliability is not low (NO in step S52), the MPU 22 writes the data by a normal method (step S54). That is, the MPU 22 selects word lines and bit lines regardless of their positions.

Although the determination method in steps S51 and S52 can be appropriately selected, two examples will be explained below. FIG. 18 is a table (to be referred to as an error table hereinafter) showing the relationship between each of memory blocks BLK0 to BLKn and an ECC (Error Checking and Correcting) error occurrence ratio. The MPU 22 counts ECC errors having occurred in the memory blocks BLK0 to BLKn, calculates occurrence ratios R0 to Rn, and holds them as an error table in a RAM 25. The RAM 25 also holds an occurrence ratio threshold Rth. In step S51, the MPU 22 reads out an occurrence ratio Ri (i is one of 0 to n) of the memory block corresponding to the generated block address and the occurrence ratio threshold Rth, and determines that the reliability is low if Ri>Rth. For example, if a block address corresponding to the memory block BLK0 is generated, the MPU 22 reads out the occurrence ratio R0 and occurrence ratio threshold Rth from the RAM 25. If R0>Rth, the MPU 22 determines that the reliability is low because many ECC errors have occurred in the memory block BLK0 (YES in step S52).

Figure 19A:
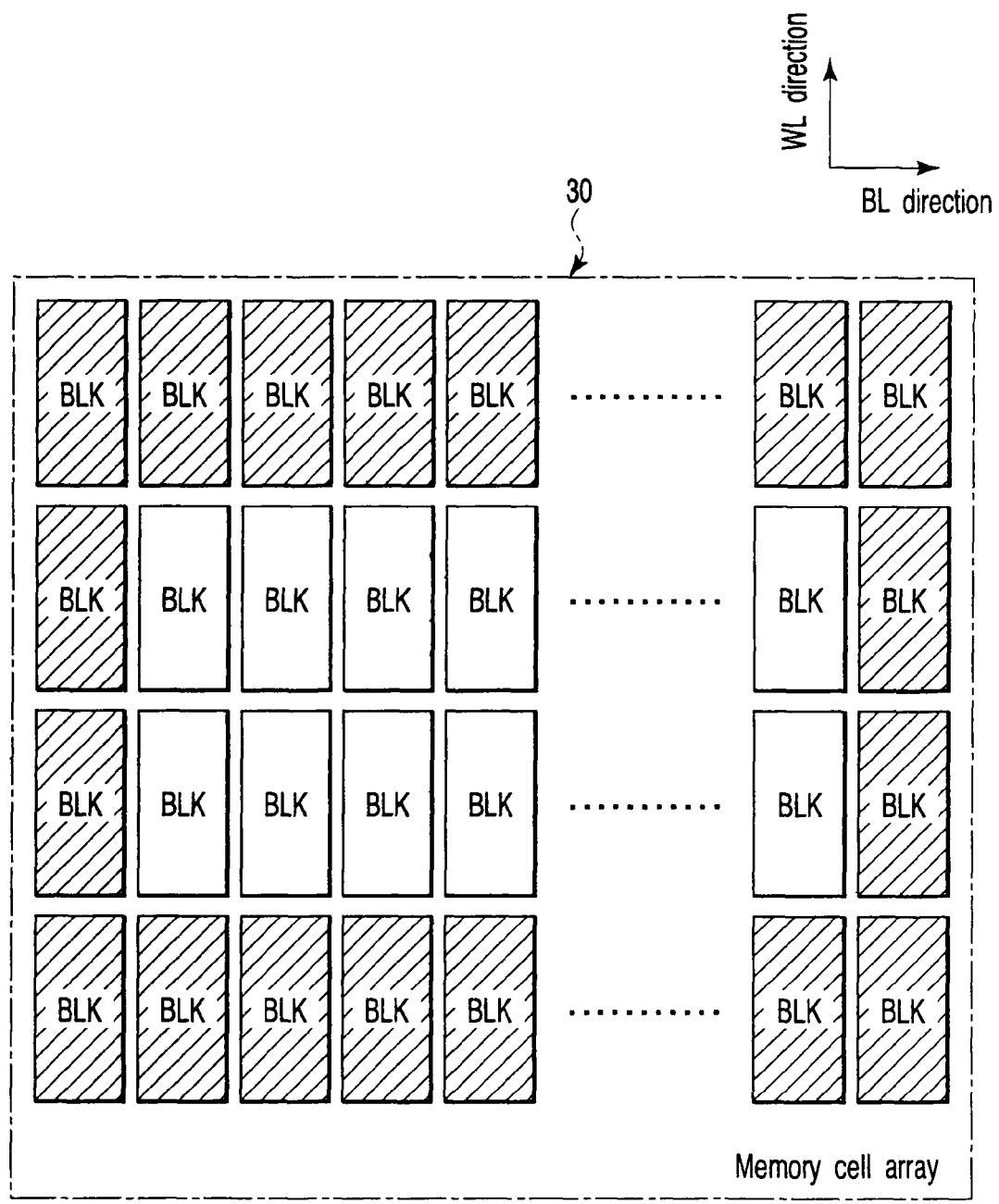
FIGS. 19A and 19B are block diagrams of a memory cell array of a flash memory according to the fifth embodiment of the present invention, which illustrate the arrangement of memory blocks.
Figure 19B:
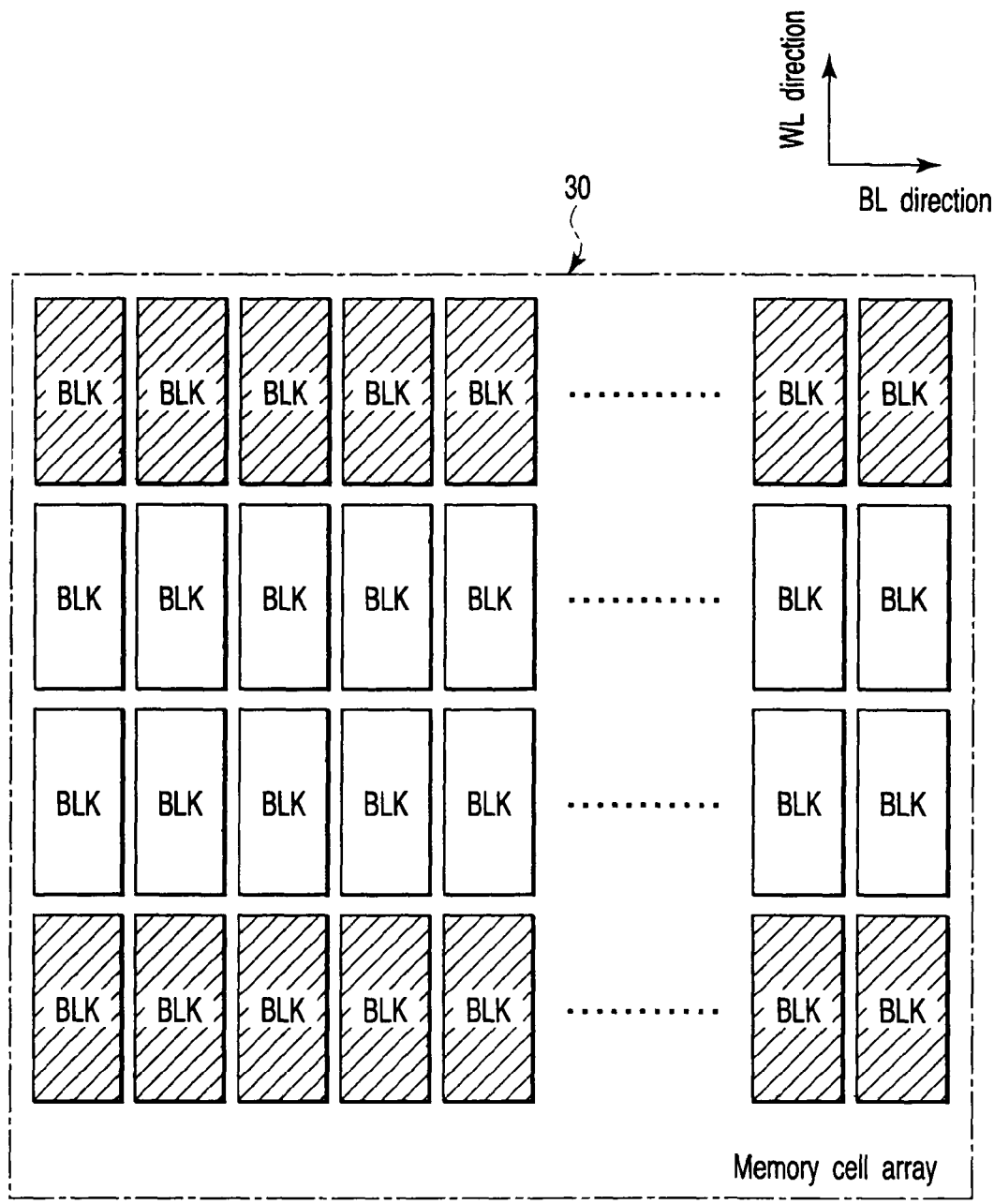

The other method will be explained with reference to FIGS. 19A and 19B. FIGS. 19A and 19B are block diagrams of a memory cell array 30, and illustrate the arrangement of the memory blocks BLK. As shown in FIGS. 19A and 19B, the MPU 22 determines that memory blocks BLK (hatched memory blocks in FIGS. 19A and 19B) positioned at the end portions in the memory cell array 30 have low reliability. More specifically, as shown in FIG. 19A, when memory blocks (memory blocks not hatched in FIG. 19A) surrounded by other memory blocks are selected, the MPU 22 determines that the reliability of the selected memory blocks is not low. Alternatively, as shown in FIG. 19B, when memory blocks (memory blocks not hatched in FIG. 19B) each having two opposing sides sandwiched between other memory blocks are selected, the MPU 22 determines that the reliability of the selected memory blocks is not low.

As described above, the memory system according to this embodiment achieves effect (5) below in addition to effects (1) to (4) explained in the first to fourth embodiments.

(5) The memory cell array can be efficiently used.

This embodiment applies the write method explained in the first to fourth embodiments to only memory blocks BLK found to have low reliability, and the conventional method to other memory blocks. This makes it possible to efficiently use word lines and bit lines to which the methods of the above embodiments need not be applied.

As described above, the memory systems according to the first to fifth embodiments of the present invention write data requiring reliability, e.g., the system information by avoiding word lines and bit lines that often cause bit errors. Accordingly, it is possible to improve the system information holding characteristic and reliability of the memory system.

Figure 20:
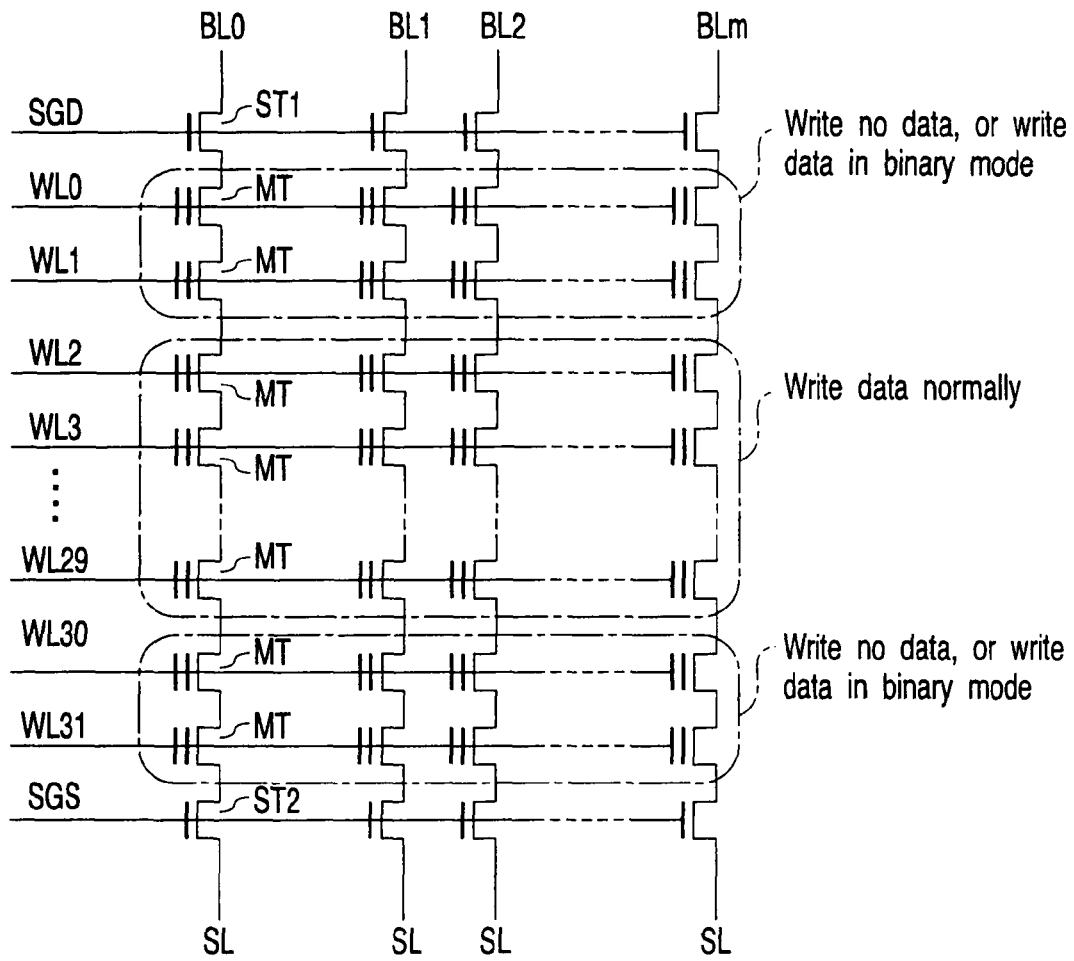
FIG. 20 is a circuit diagram of a memory block of a flash memory according to the first modification of the first to fifth embodiments of the present invention, which shows the way the system information is written.

Note that each of the above embodiments has explained the case that word lines are selected by avoiding only the word lines WL0 and WL31. As shown in a circuit diagram of FIG. 20, however, it is also possible to leave the two word lines WL0 and WL1 on the side of the select gate line SGD and the two word lines WL30 and WL31 on the side of the select gate line SGS unselected, or write data in these word lines in the binary mode. It is a matter of course that the number of word lines not to be selected need not be two but may also be three or more and the number of word lines not to be selected on the side of the select gate line SGD can be different from that on the side of the select gate line SGS. This is of course similarly applicable to bit lines. That is, it is possible to leave the bit lines BL0 and BL1 and the bit lines BL(m-1) and BLm at the memory block end portions unselected, or write data in these bit lines in the binary mode. Also, the number of bit lines not to be selected need not be two but may also be three or more, and the number of bit lines not to be selected on the side of the bit line BL0 can be different from that on the side of the bit line BLm.

Figure 21:
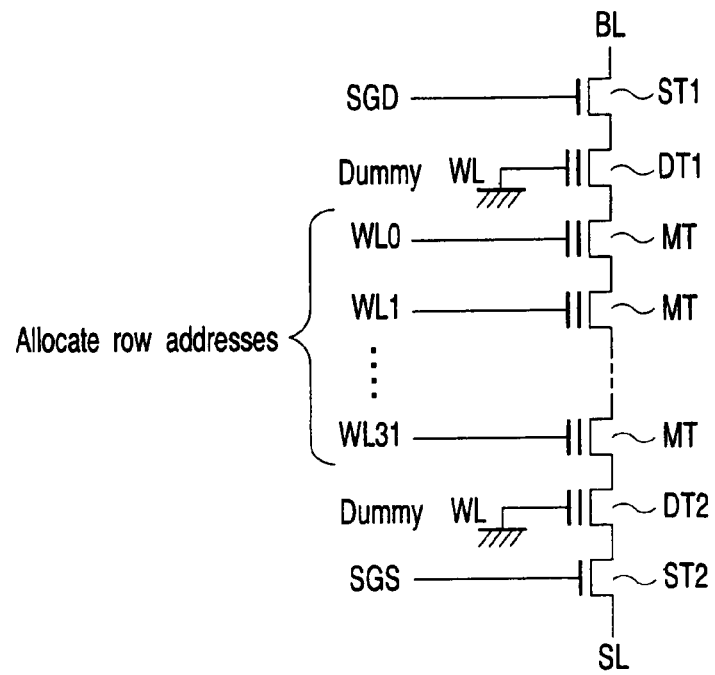
FIG. 21 is a circuit diagram of a NAND cell of a flash memory according to the second modification of the first to fifth embodiments of the present invention.

Furthermore, the present invention is also applicable to the case that a dummy word line is formed between the select gate line SGD and word line WL0 or/and between the select gate line SGS and word line WL31. FIG. 21 is a circuit diagram of a NAND cell. As shown in FIG. 21, this NAND cell has dummy transistors DT1 and DT2. The dummy transistor DT1 has a drain connected to the source of the selection transistor ST1, and a source connected to the drain of the memory cell transistor MT connected to the word line WL0. The dummy transistor DT2 has a source connected to the drain of the selection transistor ST2, and a drain connected to the source of the memory cell transistor MT connected to the word line WL31. The gates of the dummy transistors DT1 and DT2 are connected to dummy word lines. The dummy word lines are grounded so as not to be selected. Note that the dummy transistors DT1 and DT2 connected to the dummy word lines have a negative threshold voltage, and are normally ON. That is, no row addresses are allocated to the dummy word lines; row addresses are allocated to only the word lines WL0 to WL31.

Figure 22:
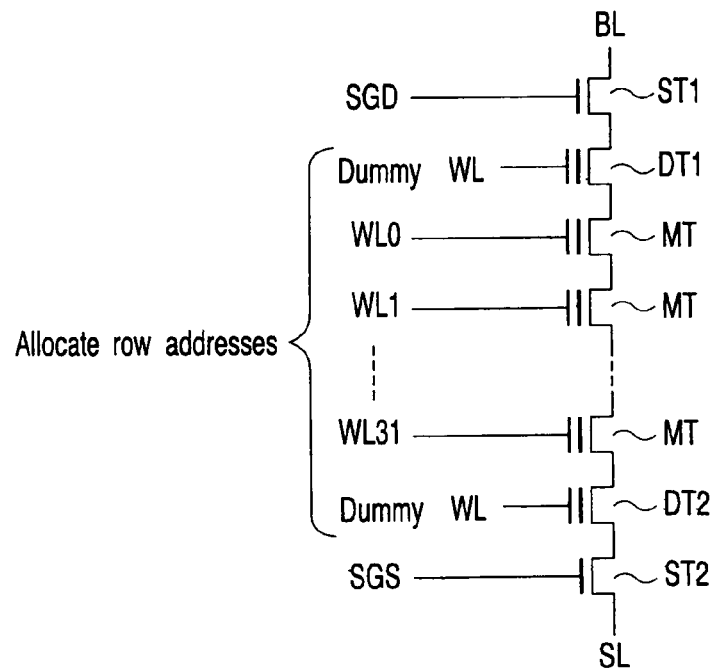
FIG. 22 is a circuit diagram of a NAND cell of a flash memory according to the third modification of the first to fifth embodiments of the present invention.

FIG. 22 shows another arrangement including dummy word lines. FIG. 22 is a circuit diagram of a NAND cell. As shown in FIG. 22, the arrangement of this NAND cell is the same as FIG. 21 except that the dummy word lines are not grounded. In this arrangement shown in FIG. 22, the dummy word lines are also connected to the row decoder 32, but the row decoder 32 does not select these dummy word lines. That is, row addresses are allocated to the dummy word lines as well, but the card controller 12 generates a page address so as not to select the dummy word lines.

The first to fifth embodiments are also applicable to the arrangements shown in FIGS. 21 and 22 to write the system information by avoiding the word lines WL0 and WL31 or in the binary mode. To avoid word lines having low reliability, however, when writing the system information, it is also possible to use a method that uses the word lines WL0 and WL31 in the case shown in FIG. 21, and does not use the word lines WL0 and WL31 in the case shown in FIG. 22.

Figure 23:
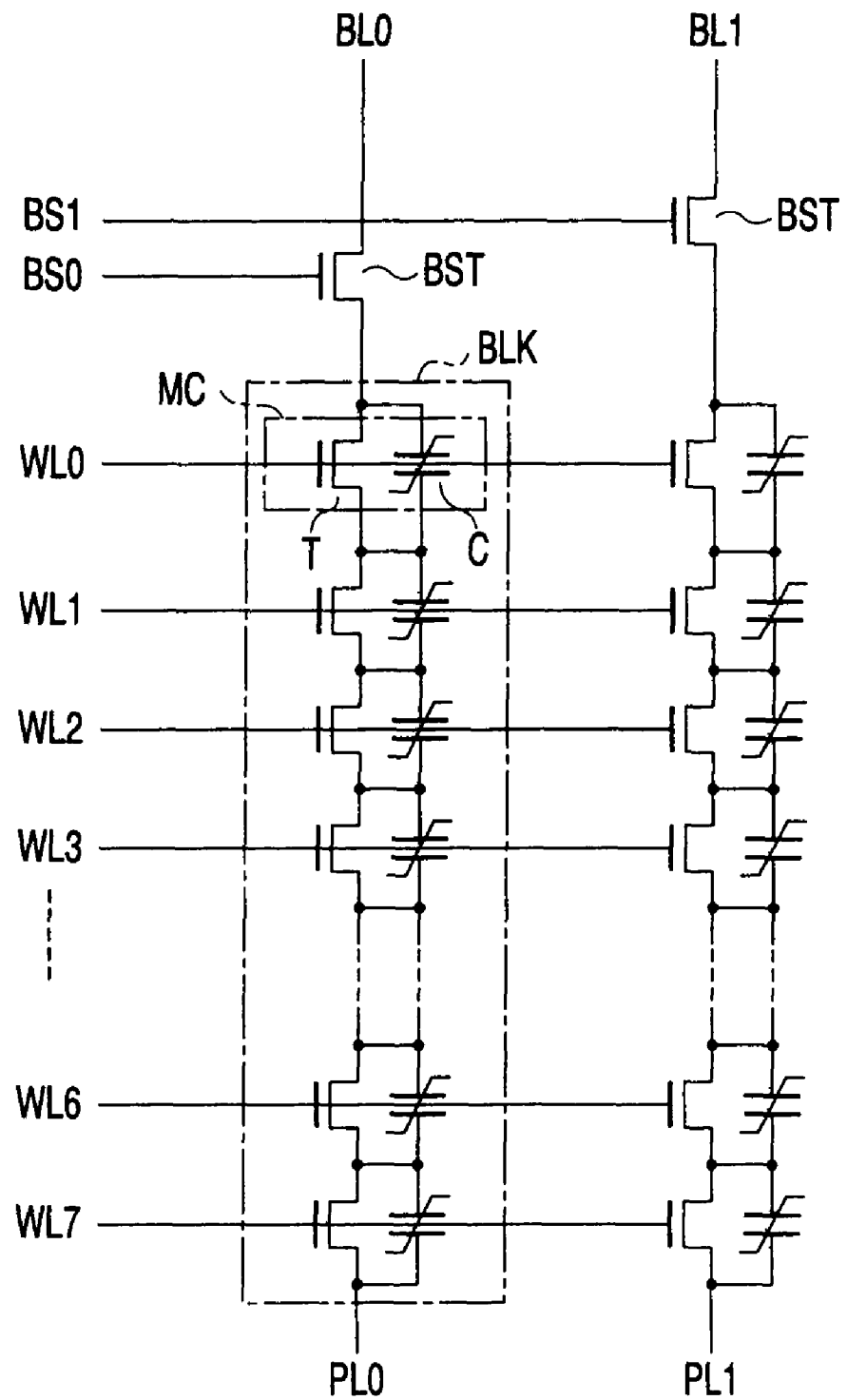
FIG. 23 is a circuit diagram of a memory cell array of a TC parallel unit series-connected ferroelectric memory.

The first to fifth embodiments can also be applied to semiconductor memories other than the NAND flash memory. That is, the present invention is widely applicable to any semiconductor memory having an arrangement in which a plurality of bit lines are regularly arranged, and bit errors occur when the regularity breaks as in the NAND flash memory. As an example, the present invention is also applicable to "a TC parallel unit series-connected ferroelectric memory" in which the two terminals of a capacitor (C) are connected between the source and drain of a cell transistor (T) to form a unit cell, and a plurality of unit cells are connected in series. FIG. 23 is a view showing an example of the arrangement of the main part of this ferroelectric memory.

That is, FIG. 23 is a circuit diagram showing a portion of a memory cell array of the TC parallel unit series-connected ferroelectric memory. As shown in FIG. 23, this memory cell array includes cell blocks BLK and block selection transistors BST. The cell block BLK includes a plurality of series-connected memory cells MC. Referring to FIG. 23, the number of memory cells MC included in one memory block is eight. However, the number of memory cells MC is of course not limited to eight, and can also be 16 or 32. The memory cell MC includes a MOS transistor T and ferroelectric capacitor C. The ferroelectric capacitor C is a capacitor element using a ferroelectric material as a capacitor insulating film. As this ferroelectric material, it is possible to use, e.g., lead zirconate titanate (Pb—Zr—Ti—O: PZT) or strontium-bismuth tantalate (Sr—Bi—Ta—O: SBT). The ferroelectric capacitor C has one electrode connected to the source of the cell transistor T, and the other electrode connected to the drain of the cell transistor T. The source of the cell transistor T is connected to the drain of the cell transistor T of an adjacent memory cell MC on one side, and the drain of the cell transistor T is connected to the source of the cell transistor T of an adjacent memory cell MC on the other side. The gate electrodes of the cell transistors T included in the memory cells MC are connected to word lines WL0 to WL7. The source of the cell transistor T of the memory cell MC positioned closest to the source and connected to the word line WL7 is connected to a plate line PL. The drain of the cell transistor T of the memory cell MC positioned closest to the drain and connected to the word line WL0 is connected to a bit line BL via the block selection transistor BST. That is, the block selection transistor BST has a source connected to the drain of the cell transistor T connected to the word line WL0, and a drain connected to the bit line BL. Also, a block selection signal line BS is connected to the gate of the block selection transistor BST.

In the above arrangement, the regularity of the word lines WL breaks in a portion where the word line WL0 and block selection signal line BS are adjacent to each other, and in a portion where the word line WL7 and plate line PL are connected. When writing data requiring reliability, therefore, a method that does not select the word lines WL0 and WL7 can be applied.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A flash memory system comprising:
a first memory which has at least a plurality of flash memory cells, each cell having a word line, connected in series, a first selection transistor having a first select gate line connected to one end of the plurality of memory cells and a second selection transistor having a second select gate line connected to another end of the plurality of memory cells; and
a memory controller including:
an interface configured to be connectable to an electric device and transfer first data to or from the first memory and a command from the device;

a second memory which temporarily holds second data; and a processor unit configured to control writing the first data in the first memory, reading the first data from the first memory, temporarily holding the second data in the second memory, and writing, in the first memory, the second data held in the second memory, wherein when writing the second data, the processor unit does not select the word lines adjacent to the first select gate line and the second select gate line, and selects the word line not adjacent to the first select gate line and the second select gate line.

2. The flash memory system according to claim 1, wherein the first memory comprises:

a memory cell group including the plurality of memory cells connected in series with the first selection transistor and the second selection transistor;

a bit line connected to a drain of the first selection transistor in each cell of the memory cell group; and a memory block including a plurality of memory cell groups, and wherein when writing the second data, the processor unit does not select the bit lines positioned at end portions of the memory block, and selects the bit lines not positioned at the end portions of the memory block.

3. The flash memory system according to claim 2, wherein when writing the second data, the processor unit does not select the bit lines adjacent to the bit lines positioned at the end portions of the memory block either.

4. The flash memory system according to claim 1, wherein the second data is system information including a correspondence between a logical address and a physical address in the first memory, and defective memory cell information.

5. The flash memory system according to claim 1, wherein the first memory comprises:

a memory cell group including the plurality of memory cells connected in series with the first selection transistor and the second selection transistor;

a bit line connected to a drain of the first selection transistor in each cell of the memory cell group; and a memory block including a plurality of memory cell groups, and wherein the processor unit checks reliability of the memory block corresponding to a block address before writing the second data, and, if the reliability does not satisfy a standard value, does not select the word lines adjacent to the first select gate line and the second select gate line, and selects the word line not adjacent to the first select gate line and the second select gate line, when writing the second data.

6. The flash memory system according to claim 5, wherein the processor unit calculates a ECC error occurrence ratio which occurred in each memory block, and holds the occurrence ratio as an error table in the second memory, the second semiconductor memory holds an occurrence ratio threshold, and when checking the reliability of the memory block, the processor unit reads out the ECC error occurrence ratio of the memory block corresponding to the block address and the occurrence ratio threshold, and determines that the reliability does not satisfy the standard value if the ECC error occurrence ratio is higher than the occurrence ratio threshold.

7. The flash memory system according to claim 5, wherein when checking the reliability of the memory block, the processor unit determines that the reliability of the memory block positioned at an end portion in a memory cell array does not satisfy the standard value.

8. The flash memory system according to claim 1, wherein when writing the second data, the processor unit does not select the word lines adjacent to the word lines adjacent to the first select gate line and the second select gate line either.

9. The flash memory system according to claim 1 wherein the first memory further comprises:

a first dummy transistor having a current path whose two ends are connected to the source of the first selection transistor and a drain of the memory cell; and a second dummy transistor having a current path whose two ends are connected to the drain of the second selection transistor and a source of the memory cell.

10. The flash memory system according to claim 9, wherein a first dummy word line and a second dummy word line respectively connected to gates of the first dummy transistor and the second dummy transistor are grounded.

11. The flash memory system according to claim 1, wherein the first data including a user data.

12. The flash memory system according to claim 11, wherein the second data including a system information.

13. The flash memory system according to claim 12, wherein the first data is a multi-value data more than 2 bits.

14. The flash memory system according to claim 12, wherein the second data is a 1 bit data.

15. The flash memory system according to claim 1, wherein when writing the first data without writing second data in the first memory, the processor unit configured to allow to select the word lines adjacent respectively to the first select gate line or the second select gate line and write multi-value data to the selected cells.

16. A flash memory system including:

a flash memory portion which writes data in a first memory including a plurality of memory cells, a first selection transistor, a second selection transistor, a first select gate line, a second select gate line and a plurality of word lines, the plurality of memory cells having current paths connected in series between a source of the first selection transistor and a drain of the second selection transistor, each of the plurality of memory cells having a control gate and a charge storage layer and being configured to hold data having at least two bits, the first and second select gate lines respectively connected to gates of the first and second selection transistors, and the plurality of word lines respectively connected to the control gates; and a memory control portion which comprises, an interface configured to be connectable to an electric device and transfer first data to or from the first memory and a command from the device;

a second memory which temporarily holds second data; and a processor unit configured to control writing the first data in the first memory, reading the first data from the first memory, temporarily holding the second data in the second memory, and writing, in the first memory, the second data held in the second memory, wherein when writing the second data, the processor unit writes one-bit data in the memory cells connected to the word lines adjacent to the first select gate line and the second select gate line, and writes the data having not less than two bits in the memory cell connected to the word line not adjacent to the first select gate line and the second select gate line.

17. The flash memory system according to claim 16 wherein even when writing the first data, the processor unit writes one-bit data in the memory cells connected to the word lines adjacent to the first select gate line and the second select gate line, and writes the data having not less than two bits in the memory cell connected to the word line not adjacent to the first select gate line and the second select gate line.

18. The flash memory system according to claim 16, wherein the second data is system information including a correspondence between a logical address and a physical address in the first memory, and defective memory cell information.

19. The flash memory system according to claim 16, wherein
the first memory comprises:
a memory cell group including the plurality of memory cells connected in series with the first selection transistor and the second selection transistor;
a bit line connected to a drain of the first selection transistor in each cell of the memory cell group; and
a memory block including a plurality of memory cell groups, and
wherein when writing the second data, the processor unit writes one-bit data in the memory cells connected to the bit lines positioned at end portions of the memory block, and writes the data having not less than two bits in the memory cell connected to the bit line not positioned at the end portions of the memory block.

20. The flash memory system according to claim 19, wherein when writing the second data, the processor unit writes one-bit data in the memory cells connected to the bit lines adjacent to the bit lines positioned at the end portions of the memory block.

21. The flash memory system according to claim 16, wherein
the first memory comprises:
a memory cell group including the plurality of memory cells connected in series with the first selection transistor and the second selection transistor;
a bit line connected to a drain of the first selection transistor in each cell of the memory cell group; and
a memory block including a plurality of memory cell groups, and wherein the processor unit checks reliability of the memory block corresponding to a block address before writing the second data, and, if the reliability does not satisfy a standard value, writes the one-bit data in the memory cells connected to the word lines adjacent to the first select gate line and the second select gate line, and writes the data having not less than two bits in the memory cell connected to the word line not adjacent to the first select gate line and the second select gate line, when writing the second data.

22. The flash memory system according to claim 21, wherein the processor unit calculates a ECC error occurrence ratio which occurred in each memory block, and holds the occurrence ratio as an error table in the second memory, the second memory holds an occurrence ratio threshold, and
when checking the reliability of the memory block, the processor unit reads out the ECC error occurrence ratio of the memory block corresponding to the block address and the occurrence ratio threshold, and determines that the reliability does not satisfy the standard value if the ECC error occurrence ratio is higher than the occurrence ratio threshold.

23. The flash memory system according to claim 16, wherein when writing the second data, the processor unit writes one-bit data in the memory cells connected to the word lines adjacent to the word lines adjacent to the first select gate line and the second select gate line.

24. The flash memory system according to claim 16, wherein the first memory further comprises:
a first dummy transistor having a current path whose two ends are connected to the source of the first selection transistor and a drain of the memory cell; and
a second dummy transistor having a current path whose two ends are connected to the drain of the second selection transistor and a source of the memory cell.

25. The flash memory system according to claim 24, wherein a first dummy word line and a second dummy word line respectively connected to gates of the first dummy transistor and the second dummy transistor are grounded.

* * * * *